United States Patent
Long et al.

(10) Patent No.: US 9,609,402 B2
(45) Date of Patent: Mar. 28, 2017

(54) OPTICAL TRANSMITTAL STORAGE NETWORKS

(71) Applicant: Amazon Technologies, Inc., Seattle, WA (US)

(72) Inventors: Jason Michael Long, Bainbridge Island, WA (US); Pragyana K. Mishra, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 76 days.

(21) Appl. No.: 14/669,503

(22) Filed: Mar. 26, 2015

(65) Prior Publication Data
US 2016/0286289 A1  Sep. 29, 2016

(51) Int. Cl.
| | | |
|---|---|---|
| H04J 14/00 | (2006.01) | |
| H04Q 11/00 | (2006.01) | |
| H04B 10/275 | (2013.01) | |
| G11C 21/00 | (2006.01) | |
| H04J 14/02 | (2006.01) | |

(52) U.S. Cl.
CPC ......... *H04Q 11/0062* (2013.01); *G11C 21/00* (2013.01); *H04B 10/275* (2013.01); *H04J 14/0283* (2013.01); *H04Q 11/0001* (2013.01); *H04Q 11/0005* (2013.01); *H04Q 2011/0092* (2013.01)

(58) Field of Classification Search
CPC .. H04J 14/0212; H04J 14/0271; H04B 10/275
See application file for complete search history.

(56) References Cited

U.S. PATENT DOCUMENTS

| | | | |
|---|---|---|---|
| 4,856,862 A | 8/1989 | Passmore et al. | |
| 2005/0022046 A1* | 1/2005 | Cheng | H04L 1/0041 714/4.2 |
| 2005/0041970 A1* | 2/2005 | Harai | H04Q 11/0005 398/51 |
| 2005/0053333 A1* | 3/2005 | Shahar | H04J 14/0241 385/48 |

(Continued)

OTHER PUBLICATIONS

International Search Report and Written Opinion of PCT Application No. PCT/US2016/023840 dated Sep. 9, 2016.

(Continued)

*Primary Examiner* — Dzung Tran
(74) *Attorney, Agent, or Firm* — Athorus, PLLC

(57) ABSTRACT

Optical networks may store information or data therein by maintaining the information or data in motion. The optical networks may include optical fiber rings configured to receive optical signals comprising the information or data and to circulate the optical signals within the optical fiber rings. The optical signals and the information or data may be transferred out of the optical fiber rings in order to amplify the optical signals (e.g., to overcome losses due to attenuation within the optical fiber rings), to analyze the optical signals according to one or more processing techniques, or to transfer the information or data to another computer device upon request. If continued storage of the information or data is required, an optical signal including the information or data may be transferred back into the optical fiber rings and may continue to circulate therein.

20 Claims, 11 Drawing Sheets

(56) References Cited

U.S. PATENT DOCUMENTS

2014/0139847 A1* 5/2014 Brezinski .............. G01N 21/45
356/496
2014/0204386 A1* 7/2014 Wang ................ G01B 9/02004
356/456

OTHER PUBLICATIONS

Poustie A J et al. "All-optical regenerative memory with full write/read capability" Optics Communications, North-Holland Publishing Co., Amsterdam, NL, vol. 154, No. 5-6, Sep. 15, 1998, pp. 277-281.

* cited by examiner

OPTICAL TRANSMITTAL STORAGE NETWORKS

BACKGROUND

Networked computer systems may include a number of homogenous or heterogeneous data sources that are configured to capture, transmit and store information or data of various types or forms in one or more data stores. For example, information or data may be captured using one or more data sources such as imaging devices (e.g., digital cameras which capture still or moving images and other information), microphones, routers or other components, and transmitted over a wireless or wired network infrastructure to one or more data stores, which may include databases (e.g., relational or distributed databases) or other file systems that may be provided in one or more discrete locations, or distributed throughout the network infrastructure.

Today, processes for capturing, transmitting and storing information or data within a networked computer system are substantially linear in nature. More specifically, information or data that is captured by a single data source is typically transmitted to a predetermined or randomly selected data store for storage. Once the information or data is digitally housed within the data store, the information or data may be identified for analysis according to one or more processing methods or techniques, recalled and transmitted to another computer device or data store for further storage, backup or review, or deleted therefrom. Thus, the information or data that is captured by one or more of the various data sources in a networked computer system may generally be characterized as either residing on a data store, or in transit from a data source or a data store to another data store.

Processes for capturing, transmitting and storing information or data may be subjected to a number of hardware limitations or constraints. For example, where the capacity of the various data sources (e.g., imaging devices, microphones or other components) to capture information or data exceeds the bandwidth of a network to accommodate its transfer, a figurative limit may be placed on the volume of the information or data that can be captured by such devices. Additionally, data stores are limited in the volume or amount of information or data that they may safely store therein. When the volume or amount of information or data maintained within a networked computer system approaches a limit, at least some of the information or data must be archived or deleted in order to accommodate newer or more recent data. This concern is particularly acute where information or data is captured by a number of data sources in a network at substantially constant rates (e.g., imaging data captured from an environment by a plurality of imaging devices at streaming rates defined by the desired levels of resolution of the imaging data). Moreover, repetitive writing and rewriting of information or data onto components of a hard drive or other data storage unit may cause wear on such components, and otherwise limit the useful life of the storage unit.

Imaging devices such as video cameras may capture and record still or moving images in digital computer-based files that may be stored in one or more hard drives, servers or other non-transitory computer-readable media. While files including imaging data may be individually captured and stored with relative ease, where a large number of cameras are provided in order to monitor various aspects of a particular space, location or facility, the amount of digital storage capacity and computer processing power that is required in order to centrally analyze, index and store such files for any relevant purpose may be overwhelming. Where a facility such as a warehouse or an airport provides a large array of digital cameras for surveillance or monitoring operations, such cameras may capture and store over a petabyte (or a million gigabytes) of video data from such cameras each day.

DETAILED DESCRIPTION

As is set forth in greater detail below, the present disclosure is directed to optical transmittal storage networks for storing information or data received from any number of data sources, such as imaging devices, that are provided in a network. More specifically, the systems and methods disclosed herein may utilize one or more optical transmittal storage networks to collect, stream, transmit, store, process, retrieve or serve information and data, such as video data and/or multimedia, in real time or near-real time, and to maintain packets of such information or data in continuous motion throughout the networks. The packets of the information or data may be stored within the optical transmittal storage networks by maintaining the packets in motion throughout the networks, which may be accomplished by introducing one or more time lags or delays into the motion of the packets using a ring or other section of highly non-linear (e.g., coiled) fibers.

In some embodiments, the information or data may be captured or otherwise collected at one or more imaging devices or other data sources and transmitted in electrical pulses or signals to a transmittal storage node, wherein the information or data may be converted into optical signals including the information or data, which may be amplified or isolated to specific wavelengths or frequencies. The optical signals may then be transferred into a ring of substantially long fibers or other media, and circulate throughout the ring. If the continued storage of the information or data included in the optical signals remains desirable, the optical signals may be transferred out of the ring and converted to one or more electrical signals in order to be reinforced or otherwise amplified to account for any losses that may have been experienced within the ring, subjected to any type or form of analysis or processing according to one or more techniques or algorithms, transmitted to one or more other devices or network components, and/or transferred back into the ring or one or more other rings of substantially long fibers or other media for circulation and storage. If storage of the information or data is no longer desired, however, then the optical signals may be actively discarded (e.g., by removing the optical signals from the ring) or passively discarded (e.g., by simply allowing the optical signals to dissipate within the ring).

Figure 1:
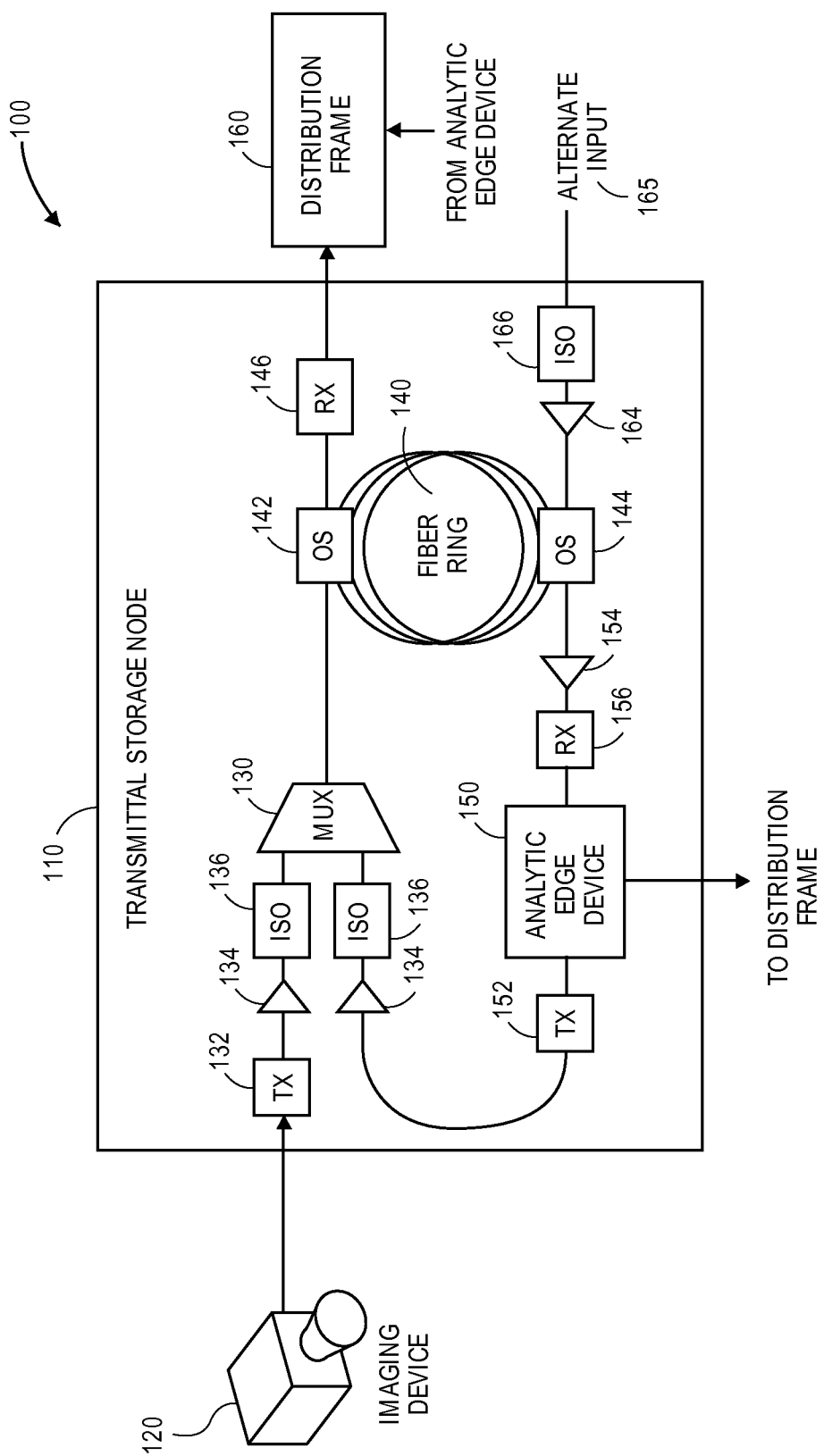
FIG. 1 is a block diagram of aspects of an optical transmittal storage network in accordance with embodiments of the present disclosure.

Referring to FIG. 1, a system including an optical transmittal storage network 100 in accordance with embodiments of the present disclosure is shown. The network 100 of FIG. 1 includes a transmittal storage node 110, an imaging device 120 or another data source, a distribution frame 160 and an alternate input 165 to the transmittal storage node 110.

The transmittal storage node 110 includes a multiplexer 130, one or more fiber rings 140 and an analytic edge device 150. The multiplexer 130 is configured to receive signal inputs from multiple sources, such as the imaging device 120 and the analytic edge device 150, or any other sources (not shown), and to forward one or more of the signal inputs via a common output. The inputs to the multiplexer 130 may be converted from electrical pulses into optical signals via optical transmitters 132, 152, and amplified via optical amplifiers 134, before being isolated to one or more discrete wavelengths, or a band of such wavelengths, by optical isolators 136.

The fiber ring 140 is a substantially long unit comprising one or more optical fibers that are arranged in a series of coils and extend between a pair of optical switches 142, 144, which may be optical phased array switches or any other type or form of optical switches (e.g., an optocoupler). The optical switch 142 may be configured to receive one or more optical signals from the multiplexer 130 and to transfer the optical signals into the fiber ring 140, within which the optical signals may circulate. Alternatively, the optical switch 142 may be configured to transfer optical signals to an optical receiver 146, where the optical signals may be converted into electrical pulses or signals, and transferred to the distribution frame 160, from which the information or data included in such electrical pulses or signals may be distributed to an external component or machine, deleted, or processed or handled in any other manner. Once an optical signal is provided to the fiber ring 140, the optical signal may circulate and recirculate throughout the fiber ring 140 until the optical signal is dissipated therein due to losses by one or more modes such as attenuation, dispersal, scattering or absorption, or until the optical signal is transferred from the fiber ring 140 for amplification or processing.

The optical switch 144 may be configured to transfer one or more of the optical signals within the fiber ring 140 to the analytic edge device 150 by way of the amplifier 154, or to duplicate one or more of the optical signals within the fiber ring 140 and transfer one or more of the duplicates of such signals to the analytic edge device 150 by way of the amplifier 154. Additionally, as is shown in FIG. 1, the optical switch 144 may be configured to receive optical signals including information or data from the alternate input 165, and transfer such optical signals into the fiber ring 140, or to the analytic edge device 150. For example, the information or data received from the alternate input 165 may be isolated to a wavelength or a band of such wavelengths by an optical isolator 166, or amplified as necessary by an optical amplifier 164.

The analytic edge device 150 may be any type or form of transfer device and/or computing component provided in parallel to the fiber ring 140. The analytic edge device 150 may be configured to receive packets of information or data from the fiber ring 140 via the optical switch 144. For example, one or more optical signals within the fiber ring 140, or one or more duplicates of such signals, may be transferred from the fiber ring 140, amplified by an optical amplifier 154, and converted to electrical pulses or signals by an optical receiver 156, before being transferred to the analytic edge device 150. The analytic edge device 150 may be in communication with the distribution frame 160 or other components for distributing information or data removed from the fiber ring 140 to one or more external components (not shown).

Once the information or data included in the electrical pulses or signals generated by the optical receiver 156 is received by the analytic edge device 150, the information or data may be subjected to one or more analyses or processing operations therein, in order to evaluate the quality or relevance of the information or data, or whether the continued storage of the information or data is desired. For example, where the information or data includes imaging data (e.g., one or more still or moving images and associated data or metadata, such as sounds), the analytic edge device 150 may process the imaging data in order to identify the various colors, textures, shapes or other features that are expressed therein, or to determine whether the imaging data includes one or more specific objects, persons or actions, or objects, persons or actions of a general type. Alternatively, the analytic edge device 150 may be configured to receive a request for the information or data included in one or more optical signals from a networked external computer device (not shown), identify the one or more optical signals which include the requested information or data, and cause the requested information or data to be transferred to the networked external computer device, e.g., by way of the distribution frame 160. Operations of the analytic edge device 150 may be controlled or manipulated internally, or in response to one or signals or instructions provided to the analytic edge device 150 from an external source, such as the alternate input 165 or a networked external computer device (not shown).

If the continued storage of the information or data contained in the electrical signal is desired, the information or data may be converted back into one or more optical signals by an optical transmitter 152, which may be amplified by the optical amplifier 134, and isolated to one or more discrete wavelengths by the optical isolator 136, before being transferred to the multiplexer 130 and passed to the optical switch 142, where the optical signals may be returned to the fiber ring 140.

Accordingly, the systems and methods of the present disclosure may include optical transmittal storage networks that are configured to collect, stream, transmit, store, process, retrieve and serve information and data, such as video data and/or multimedia, in real time or in near-real time, while packets of such information or data remain in continuous motion throughout the networks. The systems and methods disclosed herein may be utilized in connection with any networked computer system in which data is obtained from a number of data sources, e.g., imaging devices deployed in a network, and are particularly useful in connection with such networked computer systems for which the information or data captured thereby has a period of relevance having a limited duration.

Networked computer systems which include any number of sources or sensors for collecting data (e.g., imaging devices or other sensing components) are commonly provided in a number of applications, such as in large-scale surveillance or monitoring operations. Such networked systems are becoming increasingly common and popular, and are growing in size. The volume of raw computing data that may be captured by data sources or sensors of a single networked computer system or by applications operating thereon has grown exponentially in recent times. As a result, networked computer systems may occasionally be overwhelmed with raw information or data, thereby complicating efforts to identify, index or locate relevant subsets of such information or data from the mass of the raw information or data collected as a whole.

Most of the tasks associated with collecting, streaming, transmitting, storing, processing, retrieving or serving information and data are common to networked computer systems based on the size and scope of the networked computer systems, or their intended purposes. For example, some networked computer systems may be provided for the purpose of monitoring basic phenomena such as wind speeds or temperatures, or for monitoring more complex events or occurrences having a multitude of variables and factors that may change at unpredictable rates or in multiple dimensions, such as more complex atmospheric, undersea or underground events or occurrences.

One type or class of device that is commonly provided in a distributed network is an imaging device, e.g., a digital camera. Imaging devices such as digital cameras operate by capturing light that is reflected from objects, and by subsequently calculating or assigning one or more quantitative values to aspects of the reflected light, e.g., pixels, generating an output based on such values, and storing such values in one or more data stores. Imaging devices may include one or more sensors having one or more filters associated therewith, and such sensors may detect information regarding aspects of any number of pixels of the reflected light corresponding to one or more base colors (e.g., red, green or blue) of the reflected light. Such sensors may generate data files including such information, and store such data files in one or more onboard or accessible data stores (e.g., a hard drive or other like component), as well as one or more removable data stores (e.g., flash memory devices), or displayed on one or more broadcast or closed-circuit television networks, or over a computer network as the Internet. Data files that are stored in one or more data stores may be printed onto paper, presented on one or more computer displays, or subjected to one or more analyses, such as to identify items expressed therein.

Reflected light may be captured or detected by an imaging device if the reflected light is within the device's field of view, which is defined as a function of a distance between a sensor and a lens within the device, viz., a focal length, as well as a location of the device and an angular orientation of the device's lens. Accordingly, where an object appears within a depth of field, or a distance within the field of view where the clarity and focus is sufficiently sharp, an imaging device may capture light that is reflected off objects of any kind to a sufficiently high degree of resolution using one or more sensors thereof, and store information regarding the reflected light in one or more data files.

Many imaging devices also include manual or automatic features for modifying their respective fields of view or orientations. For example, a digital camera may be configured in a fixed position, or with a fixed focal length (e.g., fixed-focus lenses) or angular orientation. Alternatively, an imaging device may include one or more motorized features for adjusting a position of the imaging device, or for adjusting either the focal length (e.g., zooming the imaging device) or the angular orientation (e.g., the roll angle, the pitch angle or the yaw angle), by causing a change in the distance between the sensor and the lens (e.g., optical zoom lenses or digital zoom lenses), a change in the location of the imaging device, or a change in one or more of the angles defining the angular orientation.

For example, an imaging device may be hard-mounted to a support or mounting that maintains the device in a fixed configuration or angle with respect to one, two or three axes. Alternatively, however, an imaging device may be provided with one or more motors and/or controllers for manually or automatically operating one or more of the components, or for reorienting the axis or direction of the device, i.e., by panning or tilting the device. Panning an imaging device may cause a rotation within a horizontal axis or about a vertical axis (e.g., a yaw), while tilting an imaging device may cause a rotation within a vertical plane or about a horizontal axis (e.g., a pitch). Additionally, an imaging device may be rolled, or rotated about its axis of rotation, and within a plane that is perpendicular to the axis of rotation and substantially parallel to a field of view of the device.

Furthermore, some modern imaging devices may digitally or electronically adjust an image identified in a field of view, subject to one or more physical and operational constraints. For example, a digital camera may virtually stretch or condense the pixels of an image in order to focus or broaden the field of view of the digital camera, and also translate one or more portions of images within the field of view. Imaging devices having optically adjustable focal lengths or axes of orientation are commonly referred to as pan-tilt-zoom (or "PTZ") imaging devices, while imaging devices having digitally or electronically adjustable zooming or translating features are commonly referred to as electronic PTZ (or "ePTZ") imaging devices.

Information and/or data regarding features or objects expressed in imaging data, including colors, textures or outlines of the features or objects, may be extracted from the data in any number of ways. For example, colors of pixels, or of groups of pixels, in a digital image may be determined and quantified according to one or more standards, e.g., the RGB ("red-green-blue") color model, in which the portions of red, green or blue in a pixel are expressed in three corresponding numbers ranging from 0 to 255 in value, or a hexadecimal model, in which a color of a pixel is expressed in a six-character code, wherein each of the characters may have a range of sixteen. Moreover, textures or features of objects expressed in a digital image may be identified using one or more computer-based methods, such as by identifying changes in intensities within regions or sectors of the image, or by defining areas of an image corresponding to specific surfaces.

Furthermore, edges, contours, outlines, colors, textures, silhouettes, shapes or other characteristics of objects, or portions of objects, expressed in still or moving digital images may be identified using one or more algorithms or machine-learning tools. The objects or portions of objects may be stationary or in motion, and may be identified at single, finite periods of time, or over one or more periods or durations. Such algorithms or tools may be directed to recognizing and marking transitions (e.g., the edges, contours, outlines, colors, textures, silhouettes, shapes or other characteristics of objects or portions thereof) within the digital images as closely as possible, and in a manner that minimizes noise and disruptions, and does not create false transitions. Some detection algorithms or techniques that may be utilized in order to recognize characteristics of objects or portions thereof in digital images in accordance with the present disclosure include, but are not limited to, Canny edge detectors or algorithms; Sobel operators, algorithms or filters; Kayyali operators; Roberts edge detection algorithms; Prewitt operators; Frei-Chen methods; or any other algorithms or techniques that may be known to those of ordinary skill in the pertinent arts.

Once the characteristics of stationary or moving objects or portions thereof have been recognized in one or more digital images, such characteristics of the objects or portions thereof may be matched against information regarding edges, contours, outlines, colors, textures, silhouettes, shapes or other characteristics of known objects, which may be stored in one or more data stores. In this regard, stationary or moving objects may be classified based at least in part on the extent to which the characteristics identified in one or more digital images correspond to one or more of the characteristics of the known objects.

Imaging devices that are provided in a network, an array or a like configuration may be configured to capture and, optionally, analyze imaging data captured in a predetermined context (e.g., surveillance of a fulfillment center, warehouse or like facility for theft, fraud prevention or efficiency monitoring). In some applications, imaging devices may be provided in a networked system that is configured to continuously capture imaging data, and to analyze the imaging data to identify specific aspects therein using one or more selected classifiers that may operate on the imaging devices or one or more other computing devices associated with the networked system. Such devices may be equipped or configured to generate clips or other data files which include such aspects, or to associate one or more keywords with such aspects.

Large monitoring or surveillance networks may include tens of thousands of imaging devices, such as digital cameras, that may be configured to stream vast amounts of information or data at dozens of frames and millions of bits per second. Transferring such information or data to a central server or video storage system may consume vast portions of the available network bandwidth. Additionally, the maximum number of imaging devices that may be supported within a given area through a virtual pipe of limited bandwidth is limited, and decreases as the frame rates or levels of resolution required from one or more of such imaging devices increases. The maximum volume of information or data that may be potentially transmitted by such devices may exceed the available network bandwidth within a monitored environment, and the processing power and storage capacity required to centrally receive and store the information or data captured from such devices provided within the environment may be enormous.

Even if sufficient network bandwidth, storage capacity or processing power are provided and available to properly receive and store imaging data captured from a monitored environment, however, the tasks of indexing the imaging data, and retrieving such imaging data in response to one or more queries, are also substantially challenging. Due to the large volume of imaging data that may be received from imaging devices provided in some monitoring networks, the ability to index and parse video clips, video images or other video data files from such imaging data is limited. For example, a single digital camera may capture over a terabyte of imaging data in a given day. Currently, in many instances, such imaging data must be transferred to a central location, where the imaging data may then be processed in order to recognize objects or individuals expressed within such imaging data captured from thousands of imaging devices. Unfortunately, many existing imaging device networks are unable to achieve their stated goals of rapidly, accurately and efficiently capturing, indexing and storing imaging data in a central location to enable identifying and providing at least some of such imaging data in response to a query.

The operability of networks including one or more imaging devices, e.g., digital cameras, may be affected based on the lighting conditions and characteristics of the scenes in which the imaging devices are deployed, e.g., whether such scenes have sufficient lighting at appropriate wavelengths, whether such scenes are occluded by one or more objects, or whether such scenes are plagued by shadows or other visual impurities. The operability may also depend on the characteristics of the objects within the scenes, including variations, reflectances or deformations of their respective surfaces, as well as their sizes or textures.

Imaging data that is captured from one or more imaging devices in a network is typically transmitted over a network of cables or other connections of varying dimensions or attributes, and stored in one or more centralized servers according to one or more data management applications. The transmission of such imaging data may occupy a substantial amount of the available bandwidth in the network, however, and the imaging data may be stored on one or more drives or storage components on one or more servers in accordance with a retention policy or other established criteria. For example, a surveillance camera that captures imaging data at a rate of approximately two megabytes per second (or 2 MBps) may generate up to two hundred sixteen gigabytes (or 216 GB) of imaging data per day. Thus, where ten such cameras are provided in a network having a fourteen-day retention policy, a total of three terabytes (or 3 TB) of storage capacity is required. A network including ten thousand such cameras would, therefore, require three petabytes (or 3 PB) of storage capacity.

Storing large amounts of video footage captured using one or more imaging devices in a distributed network at one or more centralized servers provided in a fleet may be accompanied by several limitations. For example, when all of such footage is streamed directly to a server or other data storage facility and stored or otherwise written thereon, the servers will include not only relevant or desired information or data but also irrelevant or useless information or data (e.g., footage of empty shelves or vacant parking lots). Therefore, in order to analyze such footage for any given purpose, all of the available footage must be retrieved and processed, with the relevant or desired information or data being maintained, and the irrelevant or useless information or data being discarded. Such analyses result in extensive and repeated readings and writings from and to drivers or other storage components, and, where a network includes a large number of imaging devices, the volume of information or data that must be transferred may overwhelm servers or other storage units. Furthermore, the acts of transferring packets of information or data that may include one or more still or moving images and any associated audio files or other data results in an end-to-end time delay or lag that may be a function of the sizes of such packets, any intervening nodes or components through which the packets must be transferred, as well as the number of such nodes or components.

The systems and methods of the present disclosure are directed to optical transmittal storage networks having one or more nodes for storing information or data that remains in motion within the nodes. More specifically, the optical transmittal storage networks of the present disclosure may be configured to collect, stream, transmit, store, process, retrieve, and serve packets of information or data (e.g., imaging data) obtained from one or more networked data sources in real time or in near-real time, as the packets including such information or data are circulated as optical signals within a ring of optical fibers provided in one or more of the nodes.

The optical transmittal storage networks disclosed herein may be particularly useful in large-bandwidth data streaming applications, e.g., applications for the streaming of audio files, video files or other multimedia, which may be enhanced by the presence of storage facilities that are incorporated into the media through which the information or data is transferred. The information or data may be persisted within the transmission medium as long as the information or data serves a given purpose or satisfies a known demand, and may be transferred out of the transmission medium at regular or intermittent intervals for amplification or analysis and transferred back into the transmission medium, as needed.

Where the information or data included in optical signals that are circulating within a transmission medium such as an optical fiber ring has a relatively short period of relevance, the information or data may be transferred out of the transmission medium and amplified or processed, or permitted to dissipate or virtually erode within the transmission medium due to one or more losses that may be encountered therein. Furthermore, by transferring optical signals into and out of a transmission medium for amplification or processing, the information or data captured by such data sources and included in such optical signals may be filtered at regular or sporadic intervals to ensure that relevant information or data is maintained at a sufficient signal strength and circulated therein, while irrelevant information or data is deleted therefrom or allowed to die out therein. Accordingly, one or more of the transmittal storage nodes of the optical transmittal storage networks disclosed herein may be incorporated into any type or form of computer network, including computer networks that are configured to receive information from a plurality of sources and analyze the information or data "on the fly," in real time or in near-real time, as the information or data is captured and received, or shortly thereafter.

Some embodiments of the optical transmittal storage networks disclosed herein may operate according to optical buffering methods or techniques. For example, the optical transmittal storage networks described herein may be implemented using electronic network switches or routers having the capacity to retain hundreds of thousands or millions of packets of information or data in first-come, first-served queues. In this regard, the use of optical buffers in such networks may have substantial potential for enabling the processing, transmission, retrieval or storage of large amounts of captured data, or data to be streamed, in real time or in near-real time while minimizing the errors or losses inherent with processing, transmission, retrieval, storage or servicing processes. According to some embodiments of the present disclosure, the information or data may be processed, transmitted, retrieved, stored or serviced with comparatively small hardware components, relatively low operational costs, and low power consumption. Moreover, the packets may be transmitted in optical signals across large distances and at high speeds, and made available to one or more users or computer devices while the packets are stored in motion within the optical transmittal storage networks.

The optical transmittal storage networks of the present disclosure are particularly valuable in networked computer systems in which the information or data to be stored is captured or streamed at substantially constant or reliable rates. In such networked computer systems, the information or data may be circulated throughout a transmittal storage node at high throughput rates in substantially small buffers (e.g., approximately fifty packets per line card), which may enhance the efficiency with which such information or data is collected, streamed, transmitted, stored, processed, retrieved or served in any number of ways.

For example, the transmission of information or data in small buffers of packets tends to ensure that any losses and/or errors associated with the transmission of such packets are small. Likewise, the transmission of information or data in small buffers of packets enables the processing of the information or data maintained therein in real time or in near-real time using one or more analytic edge devices. Thus, transmitting packets of information or data in substantially small buffers permits the packets to be evaluated for relevance, or utilized for any other purpose, quickly and effectively, while enabling irrelevant or undesirable packets of information or data to be extracted from the networked computer system, or merely permitted to die out.

The optical transmittal storage networks of the present disclosure may include a number of components for accomplishing the collection, streaming, transmission, storage, processing, retrieval and service of information and data. For example, according to some embodiments, a transmittal storage node may include one or more compact fiber delay lines comprised of thinly clad, highly non-linear fibers and one or more optical switches, such as optical phased array switches. According to some embodiments, the fibers may be coiled or otherwise circumvolved about a bobbin, a ring or another like implement, and have a core diameter of approximately five micrometers (5 µm), a refractive index of approximately 1.4-1.5, and a length of one to two kilometers (1-2 km). Thus, in some embodiments, a fiber may have a length-to-core diameter ratio of approximately 200 million-to-1 or more. By tightly coiling or circumvolving the fibers about the bobbin, ring or other implement, multiple fibers may be provided while minimizing, or at least not increasing, any associated propagation losses or errors associated with the transmission or circulation of optical signals therein.

According to some other embodiments, the optical switches may have high switch power efficiencies (e.g., approximately two milliwatts, or 2 mW), low signal-to-noise ratios (e.g., approximately eight decibels, or 8 dB, at each output channel) and high switching speeds (e.g., approximately twenty gigahertz, or 20 GHz). Unlike, traditional electromechanical beam-steering methods, which are comparatively slow and bulky, and may consume substantial amounts of power, optical switches such as optical phased array switches may effectively deflect or switch optical beams in a motionless manner, thereby resulting in fast response times, small device footprints, comparatively low power consumption levels and relatively longer operational lifetimes.

In some embodiments, an optical phased array switch having two ingress ports (or inputs) and two egress ports (or outputs), e.g., a 2×2 switch such as the optical switches 142, 144 of FIG. 1, may be provided for causing optical signals to pass into a fiber ring or delay line, or for duplicating and/or extracting optical signals within the fiber ring or delay line, and passing the optical signals to an analytic edge device or other component. Because one ingress port of an optical switch may act as a main intake for packets of information and data, and because one egress port may be used for a main output path, an optical switch that includes more than two ingress ports (or inputs) and more than two egress ports (or outputs) may be used to link multiple highly non-linear fiber rings in parallel. For example, in some other embodiments, an optical switch may have sixty-four ingress ports (or inputs) and sixty-four egress ports (or outputs), e.g., a 64×64 switch, and may therefore accommodate sixty-three fiber rings in parallel. In this regard, the optical switches utilized in the optical transmittal network storage of the present disclosure may be utilized for Internet protocol switching or routing applications, as well.

According to still other embodiments of the present disclosure, the optical transmittal storage networks include one or more analytic edge devices, which may be any component or system configured to control the entry or transfer of optical signals into the fiber rings, the departure or transfer of the optical signals from the fiber rings, or the conversion of the optical signals into electrical signals, and to perform one or more analyses or processing on the electrical signals or any information or data contained therein. The analytic edge devices may be configured to extract circulating optical signals including packets of information or data from a fiber ring and conduct one or more operations on the information or data. For example, when the analytic edge device determines that the strength of an optical signal including packets of information or data has attenuated through multiple recirculations, the analytic edge device may cause the optical signal to be recalled from the fiber ring, amplified as necessary, converted to one or more electrical signals and pulses and analyzed therein. Alternatively, in some embodiments, the analytic edge device may be configured to recall optical signals from a fiber ring in accordance with a predetermined schedule, to convert the optical signals into electrical signals, and to amplify or analyze the information or data contained in the electrical signals. If necessary, the electrical pulses containing the information or data may be converted back to optical signals and further amplified before being returned to the fiber ring via a multiplexer and one of the optical switches.

Moreover, the analytic edge devices may be further configured to adjust the timing of the packets to align the packets within a buffer, as the arrival of the packets at the analytic edge device may be asynchronous in nature. Additionally, where an analytic edge device has ratified a buffer packet for storage after the information or data maintained therein been amplified or processed, the buffer packet may be synchronized with one or more of the buffer packets circulating throughout the fiber rings, and reintroduced or reinforced within the fiber ring, which may be configured to maintain the ordering of packets within an analytic edge device, and packets that are not reinforced within a fiber ring will eventually attenuate. An analytic edge device may be used to manipulate the transfer or routing of packets of information or data out of an optical transmittal storage node or optical transmittal storage network by controlling the operation of the optical switches in response to requests for retrieval, or the content of the information or data maintained therein. In some embodiments, the optical transmittal storage networks are capable of storing optical packets that are streamed at bandwidths of approximately forty gigabits per second (40 Gbps), or at levels of performance that are comparable to those of electrical routing devices.

The optical transmittal storage networks of the present disclosure may further include one or more small business switches (e.g., power-over-Ethernet components) and distribution frames (e.g., frames at which cables or connectors may be joined to the components of the transmittal storage node, such as by way of an output from a fiber ring by one or more of the optical switches). Furthermore, an optical transmittal storage network may include a plurality of transmittal storage nodes and transmittal storage switches that may be independently or collectively operated in order to cause packets of information or data to circulate within the optical transmittal storage network among the different nodes or switches. Providing a number of transmittal storage nodes or transmittal storage switches in a fabric or network enables lengthier delays and, therefore, longer storage or retention periods, to be introduced into the optical transmittal storage networks of the present disclosure. Although some of the embodiments disclosed herein comprise a single transmittal storage node, those of ordinary skill in the pertinent arts will recognize that the systems and methods of the present disclosure may incorporate any number of such nodes or switches.

Figure 2A:
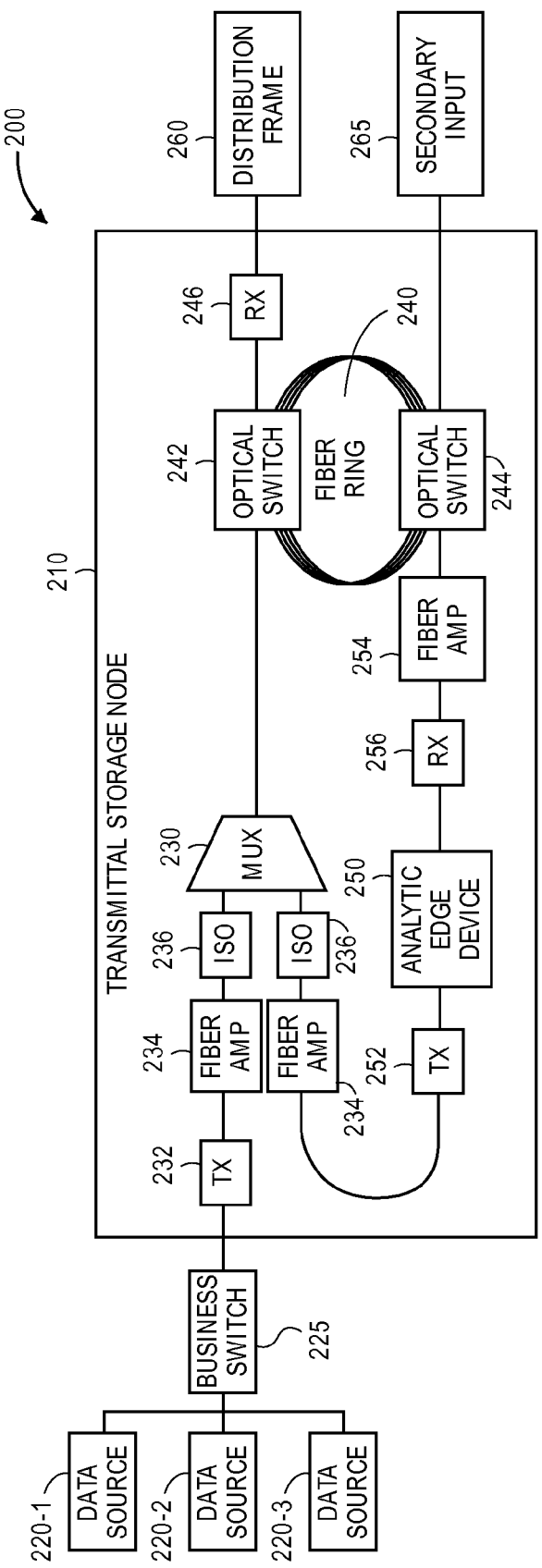
FIGS. 2A and 2B are block diagrams of components of one optical transmittal storage network in accordance with embodiments of the present disclosure.
Figure 2B:
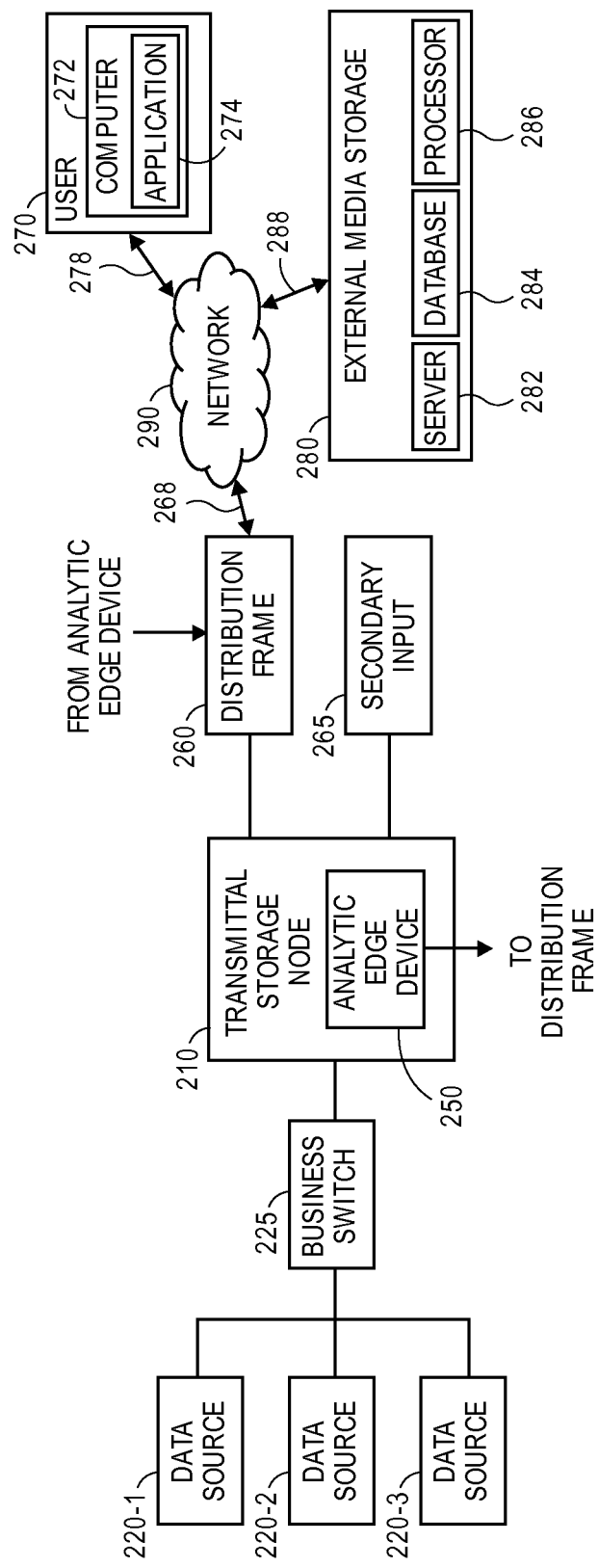

Referring to FIGS. 2A and 2B, block diagrams of components of one optical transmittal storage network 200 in accordance with embodiments of the present disclosure are shown. Except where otherwise noted, reference numerals preceded by the number "2" shown in the block diagrams of FIGS. 2A and 2B indicate components or features that are similar to components or features having reference numerals preceded by the number "1" shown in the network 100 of FIG. 1.

As is shown in FIGS. 2A and 2B, the optical transmittal storage network 200 includes a transmittal storage node 210, a plurality of data sources 220-1, 220-2, 220-3, a distribution frame 260, a secondary input 265, a user 270 and an external media storage facility 280. The distribution frame 260, the user 270 and the external media storage facility 280, and devices associated therewith, may be connected to or otherwise communicate with one another over a network 290, such as the Internet, as indicated by lines 268, 278, 288, by sending and receiving digital data.

The transmittal storage node 210 is configured to receive inputs of information or data from a number of sources, including but not limited to the data sources 220-1, 220-2, 220-3, the distribution frame 260 and the secondary input 265, as well as any number of other external computing devices or systems operated or maintained by the user 270 or the external media storage facility 280, via the network 290. As is shown in FIG. 2A, the transmittal storage node 210 includes a multiplexer 230, at least one fiber ring 240 and an analytic edge device 250.

The data sources 220-1, 220-2, 220-3 may be any type or form of sensing device configured to capture or collect one or more bits of information of data from a monitored environment or predetermined location. For example, in some embodiments, the data sources 220-1, 220-2, 220-3 may be imaging devices such as digital cameras or other optical sensors, as well as temperature sensors, heat sensors, radiation sensors or position and/or orientation sensors, or any other components for obtaining information or data of any type or form. The data sources 220-1, 220-2, 220-3 may also be operatively or functionally joined with the business switch 225 or with one or more computers or computer processor-driven devices by any wired or wireless means. Those of ordinary skill in the pertinent art will recognize that the number or type of sensors that may be provided in accordance with the present disclosure is not limited. The business switch 225 may be any type or form of component for combining electrical inputs from the data sources 220-1, 220-2, 220-3 (e.g., a power-over-Ethernet adapter) and transmitting such inputs to the transmittal storage node 210.

The multiplexer 230 is configured to receive a plurality of optical signals including packets of information or data, and to deliver one or more of such signals in a single output. As is shown in FIG. 2A, the multiplexer 230 may be configured to receive optical signals including packets of information or data from one or more of the data sources 220-1, 220-2, 220-3 by way of the business switch 225 or from the analytic edge device 250, and to transfer such signals to the optical switch 242. The packets of information or data received at the multiplexer 230 may be newly collected or captured at one or more of the data sources 220-1, 220-2, 220-3, and subjected to conversion, amplification and/or isolation by way of an optical transmitter 232, an optical fiber amplifier 234 and/or an optical isolator 236, respectively. Alternatively, the packets of information or data received at the multiplexer 230 may be included in optical signals that are converted, amplified and/or isolated based at least in part on electrical signals received from the analytic edge device 250 by way of an optical transmitter 252, an optical fiber amplifier 234 and/or an optical isolator 236, respectively.

The optical transmitter 232 may be any type or form of machine for converting an electrical signal into an optical form, or for feeding a resulting optical signal into an optical fiber. The optical transmitter 232 may include one or more optical sources, electrical pulse generators and optical modulators as may be required in order to convert electrical signals into optical signals. Additionally, the optical transmitter 232 may be a component part of, or may be, an optical transducer that is configured to convert electrical signals into optical forms and also to convert optical signals in electrical form. The conversion of electrical signals into optical forms by the optical transmitter 232 may occur over finite periods of time, and may necessarily introduce some form of delay into the process by which the information or data is received from the data sources 220-1, 220-2, 220-3 and transferred to the transmittal storage node 210.

The optical fiber amplifier 234 may be any type or form of amplifying device that is configured to increase the strength of an optical signal comprising one or more packets of information or data, such as by equalization and/or regeneration of one or more signal inputs. The amplification of optical signals, such as by the optical fiber amplifier 234, is necessary in order to overcome attenuation losses within optical fibers, including not only the fibers of the fiber ring 240 but also the optical fibers connecting the optical transmitter 232, the optical fiber amplifier 234, the optical isolator 236, the multiplexer 230 and the optical switch 242, and any other optical fibers within the transmittal storage node 210. Some optical amplifiers that may be utilized in transmittal storage nodes of the present disclosure include, but are not limited to, rare Earth metal-doped amplifiers (e.g., erbium-doped fiber amplifiers), semiconductor optical amplifiers, fiber raman amplifiers, brillouin amplifiers and others.

The optical isolator 236 may be any component that is configured to permit the transmission of light in a single direction and at one or more discrete frequencies or wavelengths, or within one or more bands of such frequencies or wavelengths, and to restrict or block light from traveling in opposite directions or at other frequencies or wavelengths. The optical isolator 236 may include one or more diodes (e.g., light-emitting diodes), insulating barriers and/or amplifiers or other components for limiting the frequencies or wavelengths of the optical signals received from the optical fiber amplifier 234.

The fiber ring 240 may include any number of substantially long optical fibers that extend between the optical switch 242 and the optical switch 244 in a non-linear (e.g., coiled) manner. In some embodiments, the fiber ring 240 may include optical fibers that are multiple kilometers in length, and may be coiled about a single bobbin or ring within the transmittal storage node 210. The optical fibers of the fiber ring 240 are provided to receive optical signals containing packets of information or data, e.g., by way of the optical switch 242 or the optical switch 244, and to permit such optical signals to be persistently circulated therein. Additionally, the circulation of such optical signals throughout the fiber ring 240 introduces an inherent delay in the transmission of the packets of information or data captured therein. If the retention of the packets of information contained in such optical signals is desired, the optical signals may be regularly removed from the fiber ring 240, amplified and returned to the fiber ring 240, thereby enabling the fiber ring 240 to effectively store such packets therein for a predetermined time. If the retention of such packets is no longer desired, the optical signals may be extracted from the fiber ring 240 or, alternatively, permitted to dissipate therein through attenuation or other losses occurring naturally within the fiber ring 240.

The optical switches 242, 244 may be any components or devices having multi-channel ports (e.g., optocouplers) for causing optical signals to enter the fiber ring 240, or be removed from the fiber ring 240. For example, the optical switches 242, 244 may be optical phased array switches having two or more ingress ports (or inputs), two or more egress ports (or outputs) that are characterized by having high switch power efficiencies, low signal-to-noise ratios and high switching speeds. As is shown in FIG. 2A, the optical switch 242 is configured to receive optical signals including packets of information or data from the multiplexer 230, or from within the fiber ring 240, and to cause the optical signals and packets of information or data to either enter (or remain within) the fiber ring 240, or be transferred to an optical receiver 246 for conversion into one or more electrical signals, and for a subsequent transfer to the distribution frame 260.

In some embodiments, the optical switch 242 may transfer optical signals and their respective information or data, e.g., such signals that are received from the multiplexer 230 or circulated within the fiber ring 240, into the fiber ring 240 or to the distribution frame 260 by way of the optical receiver 246. In some other embodiments, the optical switch 242 may duplicate one or more of the optical signals and transfer such duplicates and their corresponding information and data into the fiber ring 240 or to the distribution frame 260 by way of the optical receiver 246. The operation of the optical switch 242 may be autonomous, or may be controlled by the analytic edge device 250 or by another component or system.

Similarly, the optical switch 244 is also configured to receive optical signals including packets of information or data from within the fiber ring 240, or from a secondary input 265, and to cause the optical signals and packets of information or data to either enter (or remain within) the fiber ring 240, or be transferred to the analytic edge device 250 for processing or analysis, by way of the optical fiber amplifier 254 and the optical receiver 256, which may convert the optical signals and information or data into one or more electrical signals or pulses.

In some embodiments, the optical switch 244 may transfer the circulating optical signals and their respective information or data to the optical fiber amplifier 254 for amplification, and to the optical receiver 256 for conversion, prior to passing the electrical signals and the information or data therein to the analytic edge device 250. In some other embodiments, the optical switch 244 may duplicate one or more of the optical signals and transfer the duplicated signals and their corresponding information and data to the analytic edge device 250 by way of the optical fiber amplifier 254 and the optical receiver 256. The operation of the optical switch 244 may be controlled by the analytic edge device 250 or by another component or system.

The analytic edge device 250 may be any component that is configured to receive information or data provided in one or more of the optical signals circulating throughout the fiber ring 240, and to perform one or more analyses or processing operations thereon. The optical signals including such information or data may be optionally amplified, converted into one or more electrical signals, or passed to the analytic edge device 250 for processing and analysis therein. The optical signals and their packets of information or data may be extracted from or otherwise transferred out of the fiber ring 240 on any basis, such as a strength of an optical signal (e.g., to account for any attenuation or other losses within the fiber ring 240), or in response to a request for the packets of information or data contained in an optical signal that may be received from a remote user and/or computer device. The analytic edge device 250 may be configured to execute any type or form of functions, algorithms or techniques for performing information or data processing tasks using one or more computer processors residing on the analytic edge device 250 or on one or more computing devices accessible over the network 290.

In some embodiments, where the information or data includes imaging data, the analytic edge device 250 may be configured to execute or perform, or request that one or more other computer devices execute or perform, image processing tasks which include, but are not limited to, edge detection, object recognition, character recognition, image compression, image correction, image filtering, image modeling, image noise reduction, image quantization, image sampling, image scaling, image segmentation, image transformation, or image zooming. In some other embodiments, where the information or data includes audio data, the analytic edge device may be configured to execute or perform, or request that other computer devices execute or perform, one or more sound processing tasks which include, but are not limited to, audio signal processing, audio compression, speech processing, speech recognition, and the like. The analytic edge device 250 may be further configured to execute one or more encoding, encryption, decoding or decryption processes, or any other type or form of data processing functions or tasks. Additionally, as is shown in FIG. 2B, the analytic edge device 250 may be connected to the distribution frame 260 and/or any number of other external computing devices via the network 290.

The secondary input or source 265 may be any additional or alternative source of information or data, in addition to the data sources 220-1, 220-2, 220-3, that may be injected into the transmittal storage nodes 210 for storage, analysis, amplification or other purposes. The secondary source 265 may be a source of optical signals including packets of information or data, or, alternatively, a source of electrical signals that may be amplified and/or converted to optical signals before being transferred to the optical switch 244. In some embodiments, the information or data received from the secondary source 265 may be intended for storage within the transmittal storage node 210. In some other embodiments, the information or data received from the secondary source 265 may include one or more instructions for controlling the operations of the analytic edge device 250 or any other devices or components associated with the transmittal storage node 210.

The transmittal storage node 210 may also be accessed by a user 270 of a computer 272 operating one or more applications 274 thereon, which may be any entity or individual that intends to access the information or data stored within the transmittal storage node 210, or to store information or data therein. For example, the user 270 may be a customer of a streaming media service, a user of a social network, or any other person or machine having a need to store or readily access information or data for any purpose. The application 274 operating on the computer 272 may provide one or more features or user interfaces that permit the user 270 to view and access digital content, such as the content provided at one or more web sites accessible over the network 290, or content that may be stored within the transmittal storage node 210, or any other type or form of content. Also, those of skill in the pertinent art will recognize that the user 270 may use a keyboard, keypad, mouse, stylus, touch screen, or other device (not shown) or method for interacting with the computer 272 or the application 274 operating thereon, or to "select" an item, link, node, hub or any other aspect associated with the systems or methods of the present disclosure.

The external media storage facility 280 may be any facility, station or location having the ability or capacity to receive, store and/or process information or data, such as imaging data, in one or more data stores. For example, the external media storage facility 280 may be configured to receive, store or analyze digital files received from one or more of the data sources 220-1, 220-2, 220-3 over the network 290. As is shown in FIG. 2B, the external media storage facility 280 includes one or more physical computer servers 282 having a plurality of databases 284 associated therewith, as well as one or more computer processors 286. The servers 282 may be connected to or otherwise communicate with the databases 284 and the processors 286. The databases 284 may store any type of information or data, including digital media files or any like files containing multimedia (e.g., audio and/or video content), for any purpose. The servers 282 and/or the computer processors 286 may also connect to or otherwise communicate with the network 290, as indicated by line 288, through the sending and receiving of digital data.

The network 290 may include or be any wired network, wireless network, or combination thereof, and may comprise the Internet in whole or in part. In addition, the network 290 may be, in whole or in part, a personal area network, local area network, wide area network, cable network, satellite network, cellular telephone network, or combination thereof. The network 290 may also be, in whole or in part, a publicly accessible network of linked networks, possibly operated by various distinct parties, such as the Internet. In some embodiments, the network 290 may be a private or semi-private network, such as a corporate or university intranet. The network 290 may include one or more wireless networks, such as a Global System for Mobile Communications (GSM) network, a Code Division Multiple Access (CDMA) network, a Long Term Evolution (LTE) network, or some other type of wireless network. Protocols and components for communicating via the Internet or any of the other aforementioned types of communication networks are well known to those skilled in the art of computer communications and thus, need not be described in more detail herein.

The computers, servers, devices and the like described herein have the necessary electronics, software, memory, storage, databases, firmware, logic/state machines, microprocessors, communication links, displays or other visual or audio user interfaces, printing devices, and any other input/output interfaces to provide any of the functions or services described herein and/or achieve the results described herein. Additionally, the transmittal storage node 210, the analytic edge device 250, the distribution frame 260, the secondary input 265, the computer 272 and/or the external media storage facility 280 may use any web-enabled or Internet applications or features, or any other client-server applications or features including E-mail or other messaging techniques, to connect to the network 290, or to communicate with one another, such as through short or multimedia messaging service (SMS or MMS) text messages. For example, the server 282 may be adapted to transmit information or data in the form of synchronous or asynchronous messages from the external media storage facility 280 to the analytic edge device 250, the computer 272 or any computer processors associated with one or more of the data sources 220-1, 220-2, 220-3 or any other computer device in real time or in near-real time, or in one or more offline processes, via the network 290.

Those of ordinary skill in the pertinent art would recognize that the computer 272 or the external media storage facility 280 may include or operate any of a number of computing devices that are capable of communicating over the network, including but not limited to set-top boxes, personal digital assistants, digital media players, web pads, laptop computers, desktop computers, electronic book readers, and the like. The protocols and components for providing communication between such devices are well known to those skilled in the art of computer communications and need not be described in more detail herein.

The data and/or computer-executable instructions, programs, firmware, software and the like (also referred to herein as "computer-executable" components) described herein may be stored on a computer-readable medium that is within or accessible by computers or computer components such as the data sources 220-1, 220-2, 220-3, the analytic edge device 250 or the computer 272, or any other computers or control systems utilized by the distribution frame 260, the secondary input 265, the user 270 or the external media storage facility 280 and having sequences of instructions which, when executed by a processor (e.g., a central processing unit, or "CPU"), cause the processor to perform all or a portion of the functions, services and/or methods described herein. Such computer-executable instructions, programs, software and the like may be loaded into the memory of one or more computers using a drive mechanism associated with the computer readable medium, such as a floppy drive, CD-ROM drive, DVD-ROM drive, network interface, or the like, or via external connections.

Some embodiments of the systems and methods of the present disclosure may also be provided as a computer-executable program product including a non-transitory machine-readable storage medium having stored thereon instructions (in compressed or uncompressed form) that may be used to program a computer (or other electronic device) to perform processes or methods described herein. The machine-readable storage media of the present disclosure may include, but is not limited to, hard drives, floppy diskettes, optical disks, CD-ROMs, DVDs, ROMs, RAMs, erasable programmable ROMs ("EPROM"), electrically erasable programmable ROMs ("EEPROM"), flash memory, magnetic or optical cards, solid-state memory devices, or other types of media/machine-readable medium that may be suitable for storing electronic instructions. Further, embodiments may also be provided as a computer-executable program product that includes a transitory machine-readable signal (in compressed or uncompressed form). Examples of machine-readable signals, whether modulated using a carrier or not, may include, but are not limited to, signals that a computer system or machine hosting or running a computer program can be configured to access, or including signals that may be downloaded through the Internet or other networks.

Although some of the embodiments disclosed herein reference the capture, analysis, indexing, storage and retrieval of information or data using one or more imaging devices, the systems and methods are not so limited. Rather, the systems and methods disclosed herein may be utilized in any environment in which the storage of information or data is desired, and may be used to collect, stream, transmit, store, process, retrieve and serve information and data in any type of environment.

Figure 3:
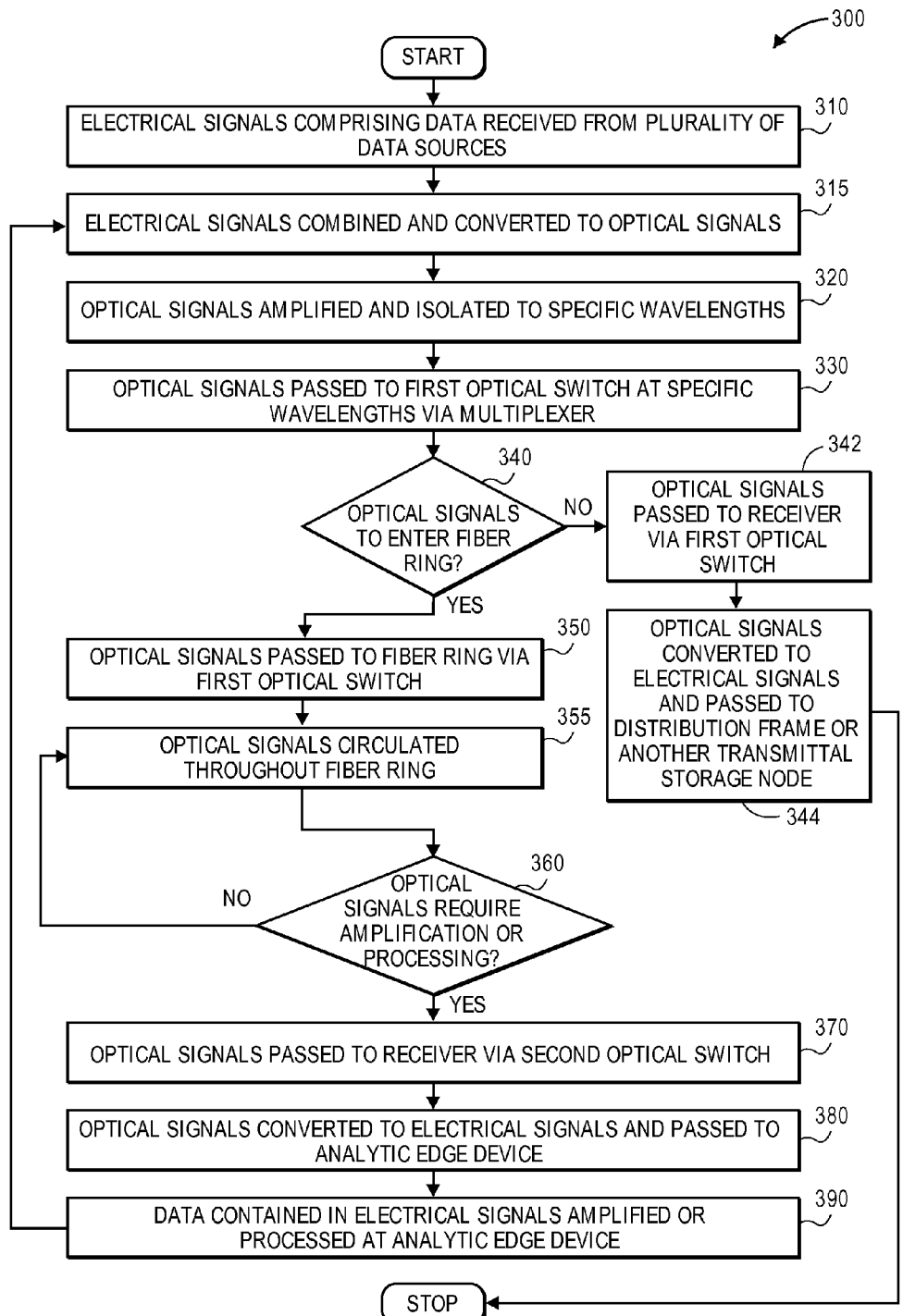
FIG. 3 is a flow chart of one process for storing information or data using an optical transmittal storage network in accordance with embodiments of the present disclosure.

Referring to FIG. 3, a flow chart 300 of one process for storing information or data using an optical transmittal storage network in accordance with embodiments of the present disclosure is shown. At box 310, electrical signals comprising data are received from a plurality of data sources. For example, the data sources may be a plurality of imaging devices, and the data received may include imaging data (e.g., still or moving images, as well as any associated information or data such as sounds or metadata). At box 315, the electrical signals comprising the data are combined and converted to optical signals, and at box 320, the optical signals are amplified and isolated to one or more specific wavelengths. For example, referring again to FIG. 2A, the electrical signals may be provided to the optical transmitter 232 via the business switch 225, amplified via the optical fiber amplifier 234 before being isolated to a discrete wavelength or band of wavelengths by the optical isolator 236.

At box 330, the optical signals are passed to a first optical switch at the specific wavelengths via a multiplexer, e.g., the multiplexer 230 of FIG. 2A. At box 340, whether the optical signals are to enter a fiber ring is determined. For example, the first optical switch may be an optical phased array switch or like switching component with two or more ingress ports (or inputs) and two or more egress ports (or outputs) that is configured to pass the optical signal to the fiber ring, or to another component or device. If the optical signals are not intended to enter the fiber ring, the process advances to box 342, where the optical signals are passed to an optical receiver via the first optical switch, and to box 344, where the optical signals are converted to electrical signals and passed to a distribution frame or to another transmittal storage node, and the process ends. If, however, the optical signals are to be passed to the fiber ring, then the process advances to box 350, where the optical signals are passed to the fiber ring, and to box 355, where the optical signals are circulated throughout the fiber ring.

At box 360, whether the optical signals within the fiber ring require amplification or processing is determined. For example, with regard to amplification, an analytic edge device or other component may determine or estimate the intensity or strength of the optical signals, or an elapsed time that the optical signals have circulated throughout the fiber ring without amplification or analysis. With regard to processing, the analytic edge device or other component may determine whether a request for one or more packets of information or data within an optical signal are requested from a user or another computer device, or whether one or more of the packets is to be subject to processing according to a regular schedule or other protocol. For example, where the optical signals comprise packets of imaging data, the imaging data may be subjected to one or more analyses or processing methods either in real time, in near-real time, or according to a schedule, or singly or in one or more batches. The analyses or processing methods may be selected on any basis.

If the optical signals within the fiber ring do not require amplification or processing, then the process returns to box 355, where the optical signals continue to recirculate throughout the fiber ring. If amplification or analysis of the optical signals is desired, however, then the process advances to box 370, where the optical signals are passed to an optical receiver via a second optical switch, which, like the first optical switch, may be an optical phased array switch or any like component with two or more ingress ports (or inputs) and two or more egress ports (or outputs). At box 380, the optical signals are converted to electrical signals via an optical receiver or like device, and passed to an analytic edge device.

At box 390, the data contained in the electrical signals may be amplified or processed at the analytic edge device. For example, where the optical signals include packets of imaging data, the analytic edge device may execute, or cause to be executed, one or more processing algorithms or methods on the still or moving images and any associated metadata (e.g., edge detection, object recognition, character recognition, image compression, image correction, image filtering, image modeling, image noise reduction, image quantization, image sampling, image scaling, image segmentation, image transformation, or image zooming). Alternatively, the analytic edge device may cause the data to be amplified using one or more amplifiers or amplification techniques. After the amplification or analysis of the data included in the electrical signals is complete, the process returns to box 315, where the electrical signals are combined and converted back to optical signals, which may be amplified or isolated at box 320, passed to the first optical switch at box 330, and either transferred back into the fiber ring at box 350, or passed to an optical receiver at box 342 and converted to electrical signals before being passed to the distribution frame or another transmittal storage node at box 344.

Accordingly, the systems and methods of the present disclosure, such as the process for storing information or data using an optical transmittal storage network of flow chart 300, may be used to collect, stream, transmit, store, process, retrieve or serve information and data, such as video data and/or multimedia, in real time or near-real time. Packets of the information or data may be persisted in optical signals that may be permitted to recirculate throughout a transmittal storage node, and may be amplified, as needed, until the information or data is desired for analysis or processing. If the information or data circulating throughout the fiber ring is no longer desired, the optical signals containing such packets may be removed via a distribution frame or other component, such as is shown in FIG. 3, or simply permitted to dissipate within the fiber ring.

Figure 4A:
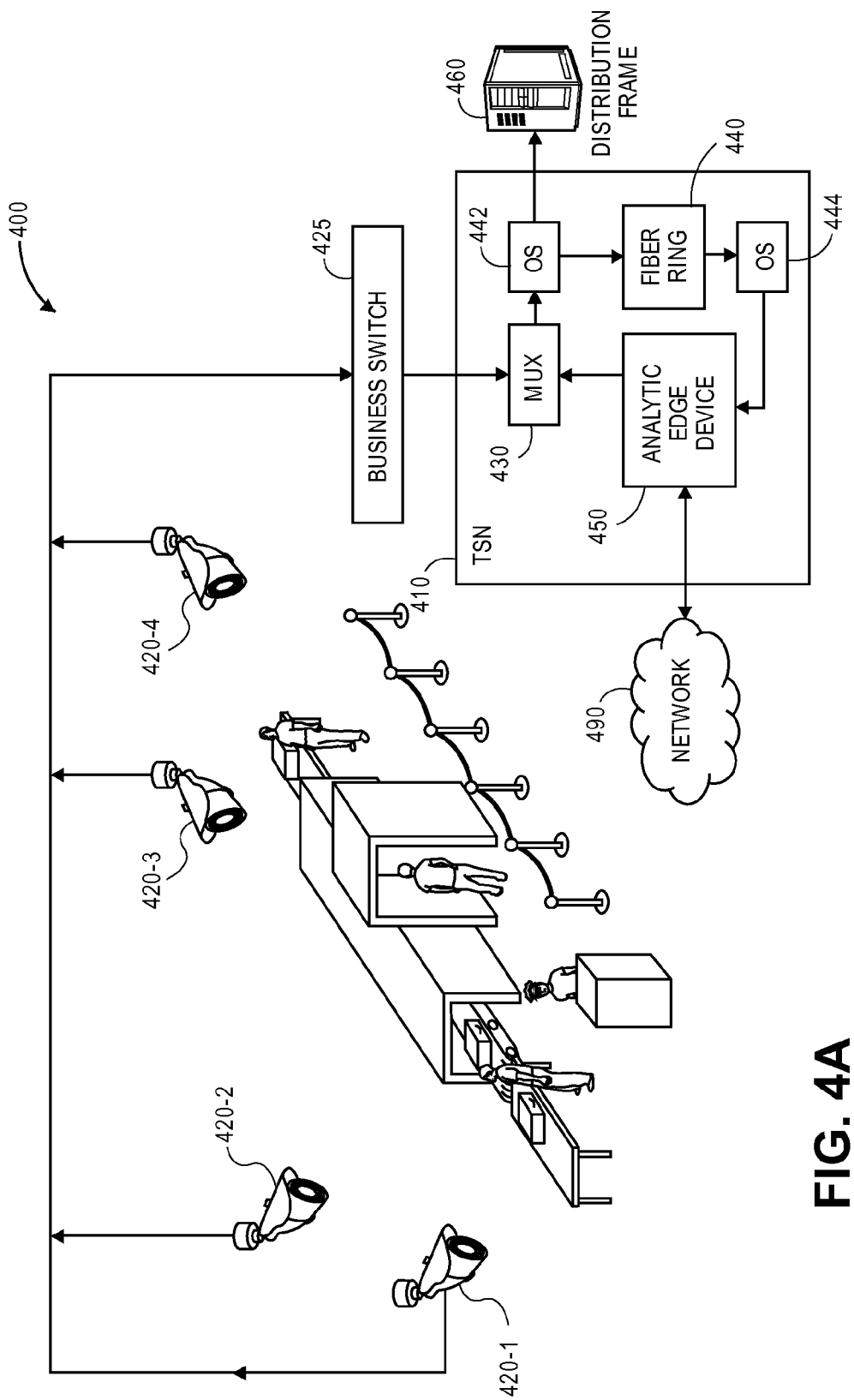
FIGS. 4A and 4B are views of aspects of one system including an optical transmittal storage network in accordance with embodiments of the present disclosure.

The optical transmittal storage networks of the present disclosure may be utilized in any applications, and may be particularly useful in surveillance or monitoring applications in which large numbers of imaging devices are deployed in networks. In such applications, the persistent storage of imaging data in packets circulating throughout one or more optical fiber rings enables the information or data captured by such imaging devices to be processed according to a predetermined schedule or on an as-needed basis. Referring to FIG. 4A, one embodiment of an optical transmittal storage network 400 of the present disclosure is shown. Except where otherwise noted, reference numerals preceded by the number "4" shown in the block diagram of FIG. 4A indicate components or features that are similar to components or features having reference numerals preceded by the number "2" shown in the block diagrams of FIG. 2A or FIG. 2B or by the number "1" shown in the network 100 of FIG. 1.

As is shown in FIG. 4A, the optical transmittal storage network 400 is provided in a surveillance or monitoring application, viz., in association with an entry point at an airport. The optical transmittal storage network 400 includes a transmittal storage node 410, a plurality of imaging devices 420-1, 420-2, 420-3, 420-4, a business transfer switch 425 and a distribution frame 460. The transmittal storage node 410 further includes a multiplexer 430, an optical fiber ring 440, first and second optical switches 442, 444, and an analytic edge device 450 connected to a network 490, such as the Internet.

The imaging devices 420-1, 420-2, 420-3, 420-4 are shown as mounted above the entry point at the airport in predetermined locations, in order to capture imaging data independently from the perspectives of such predetermined locations. Imaging data captured by such imaging devices 420-1, 420-2, 420-3, 420-4 is transmitted to the business switch 425, and into the transmittal storage node 410 by way of the multiplexer 430. From the multiplexer 430, optical signals including the imaging data may be transferred to the first optical switch 442, which may be an optical phased array switch or any other type or form of optical switch having two or more ingress ports (or inputs) and two or more egress ports (or outputs). The first optical switch 442 may then determine whether the optical signals and their respective packets of information or data are to be transferred out of the transmittal storage node 410, e.g., to the distribution frame 460 and/or to another external computer device (not shown), or into the optical fiber ring 440, within which the optical signals may circulate until the optical signals attenuate due to one or more losses, or are transferred therefrom by the first optical switch 442 or the second optical switch 444.

The analytic edge device 450 may recall optical signals including packets of the imaging data from the optical fiber ring 440 by way of the second optical switch 444 on any basis. For example, the packets may be recalled in order to amplify the optical signals, or to conduct one or more analyses or processing operations on the imaging data contained in such packets. When one or more packets of imaging data are identified for extraction, e.g., by the analytic edge device 450, the second optical switch 444 may then transfer optical signals containing the packets of imaging data out of the optical fiber ring 440 via the second optical switch 444, optionally convert the optical signal to an electrical signal that also contains the imaging data, and provide the imaging data to the analytic edge device 450 for amplification or processing. Alternatively, the second optical switch 444 may duplicate the optical signals containing the packets of imaging data, optionally convert the duplicate optical signals to electrical signals containing the imaging data, and transfer the imaging data to the analytic edge device 450 for amplification or processing while allowing the original optical signals to dissipate within the optical fiber ring 440.

Within the analytic edge device 450, imaging data included in the electrical signals may be amplified or processed according to one or more techniques or algorithms, e.g., to extract information regarding the contents of the imaging data, to detect and recognize one or more persons, objects or events represented therein, or to perform any other processing operations on the imaging data. Such techniques or algorithms may be performed in series or in parallel, and according to a predetermined schedule, at random or whenever a need for the imaging data to be processed arises. For example, the analytic edge device 450 may be configured to operate one or more classifiers on all of the imaging data transferred out of the optical fiber ring 440 by the second optical switch 444, while operating one or more other classifiers on some of the imaging data. If the continued storage of the imaging data within the transmittal storage node 410 is desired, optical signals including the imaging data may be returned to the optical fiber ring 440 via the multiplexer 430 and the first optical switch 442. Alternatively, if the continued storage of the imaging data within the transmittal storage node 410 is no longer desired, the imaging data may be deleted from the analytic edge device 450, or transferred to the distribution frame 460 for external storage or deletion. Additionally, information or data (e.g., one or more reports) regarding the status or contents of the optical fiber ring 440, or the results of analyses of the imaging data stored in the optical fiber ring 440, may be generated at the analytic edge device 450 and transferred to one or more external computer devices (not shown) via the network 490.

The information or data received by or stored within an optical transmittal storage device or network, of the present disclosure may be amplified or processed in real time or in near-real time, or on a periodic basis, e.g., in accordance with a predetermined schedule. In some embodiments, an optical signal containing packets of information or data may be transferred out of an optical fiber ring and amplified at regular intervals by one or more analytic edge devices or like components, or transferred to one or more other optical transmittal storage devices or networks. For example, where information or data circulating within an optical fiber ring is to be analyzed subject to a number of different processing techniques or algorithms, the optical signals including such information or data may be transferred out of the optical fiber ring at a first time, optionally converted to electrical signals, analyzed according to a first one of the processing techniques or algorithms, converted back to optical signals if necessary, and returned to the optical fiber ring or transferred into another optical fiber ring, only to be extracted from the optical fiber ring at a second time, optionally converted to electrical signals again, analyzed according to a second one of the processing techniques or algorithms, converted back to optical signals if necessary, and returned to the optical fiber ring or transferred into another optical fiber ring, and so on and so forth. Moreover, processes for amplifying or processing information or data included in such signals may be performed together, either simultaneously or in parallel, or on a staggered or serial schedule.

Figure 4B:
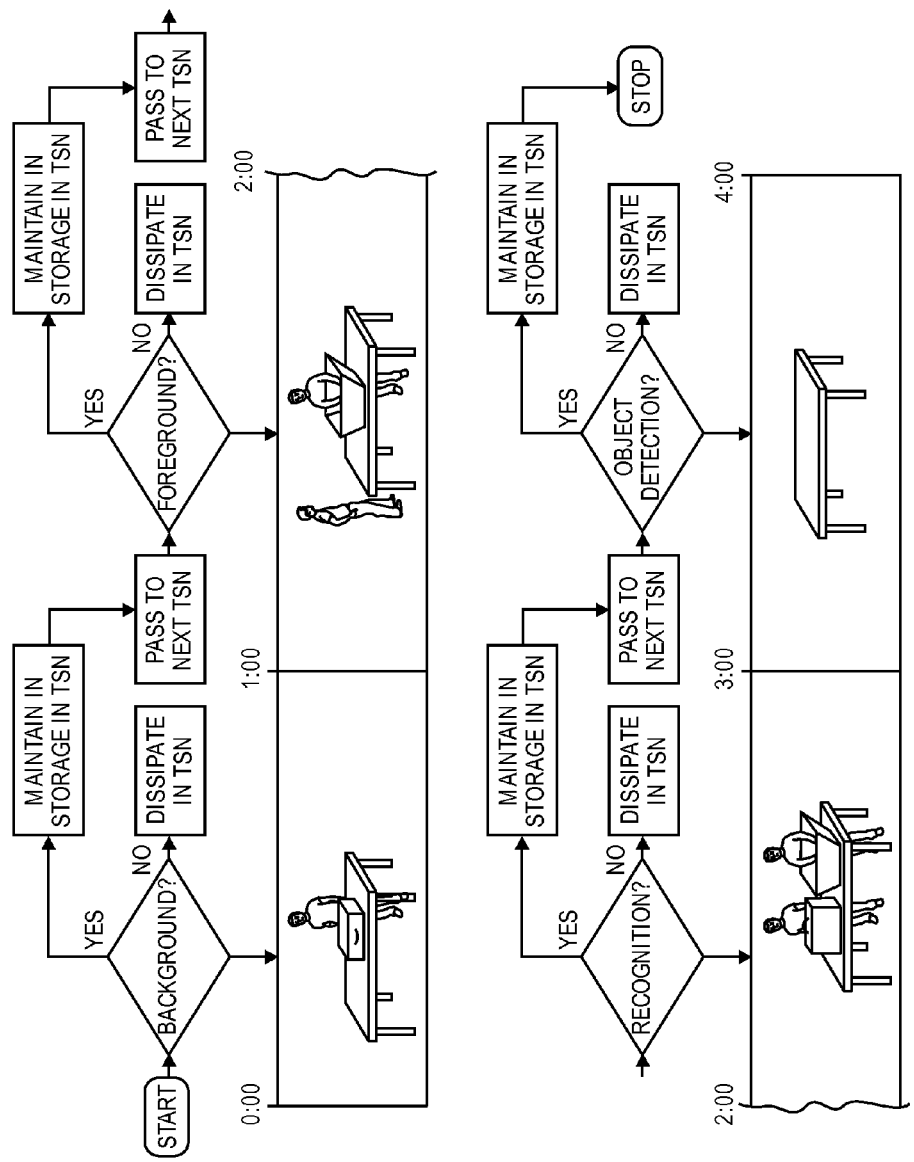

Referring to FIG. 4B, the processing of imaging data obtained from one of the imaging devices 420-1, 420-2, 420-3, 420-4 of the optical transmittal storage network 400 of FIG. 4A according to one embodiment of the present disclosure is shown. The imaging data may be processed according to a predetermined number of algorithms or techniques at regular intervals of time and/or amplified according to a schedule that ensures that the quality of the imaging data contained therein remains adequate, using one or more optical transmittal storage networks or components that may be provided for general or dedicated purposes.

For example, as is shown in FIG. 4B, optical signals including imaging data may be transferred out of an optical fiber ring in a first transmittal storage node at a first predetermined time after the imaging data has been captured, e.g., approximately thirty seconds, and analyzed to determine whether the imaging data contains any relevant background features, e.g., one or more aspects of a scene or environment. If the imaging data includes any such features, the optical signals may be amplified and returned to the optical fiber ring of the first transmittal storage node for storage, and/or also transferred to an optical fiber ring of a second transmittal storage node for further analysis. If the imaging data does not include any relevant background features, then the optical signals may be permitted to dissipate within the optical fiber ring of the first transmittal storage node, and/or also transferred to the second transmittal storage node.

At a second predetermined time after the imaging data has been captured, e.g., approximately ninety seconds, the optical signals may be transferred out of the optical fiber ring of the second transmittal node and analyzed to determine whether the imaging data contains any relevant foreground features, e.g., the presence or absence of any persons or objects. If the imaging data includes any such features, the optical signals may be amplified and returned to the optical fiber ring of the second transmittal storage node for storage, and/or also transferred to an optical fiber ring of a third transmittal storage node for further analysis. If the imaging data does not include any relevant background features, then the optical signals may be permitted to dissipate within the optical fiber ring of the second transmittal storage node, and/or also transferred to the third transmittal storage node.

At a third predetermined time after the imaging data has been captured, e.g., approximately one hundred fifty seconds, the optical signals may be transferred out of the optical fiber ring of the third transmittal node and analyzed to recognize any faces expressed therein, e.g., according to one or more facial recognition algorithms or techniques. If one or more faces are recognized in the imaging data, the optical signals may be amplified and returned to the optical fiber ring of the third transmittal storage node for storage, and/or also transferred to an optical fiber ring of a fourth transmittal storage node for further analysis. If the imaging data does not include any faces, or if no such faces are recognized, then the optical signals may be permitted to dissipate within the optical fiber ring of the third transmittal storage node, and/or also transferred to the fourth transmittal storage node.

At a fourth predetermined time after the imaging data has been captured, e.g., approximately two hundred ten seconds, the optical signals may be transferred out of the optical fiber ring of the fourth transmittal node and analyzed to recognize any objects expressed therein, e.g., according to one or more object recognition algorithms or techniques. If one or more objects are recognized in the imaging data, the optical signals may be amplified and returned to the optical fiber ring of the fourth transmittal storage node for storage. If the imaging data does not include any such objects, or if no such objects are recognized, then the optical signals may be permitted to dissipate within the optical fiber ring of the fourth transmittal storage node.

Accordingly, the systems and methods of the present disclosure may include optical transmittal storage networks that are configured to store information and data by maintaining the information or data in motion within one or more optical fiber rings, or by selectively transferring the information or data out of such optical fiber rings, e.g., for amplification or reinforcement, for analysis or processing, or for storage or processing in association with another optical fiber ring.

Figure 5:
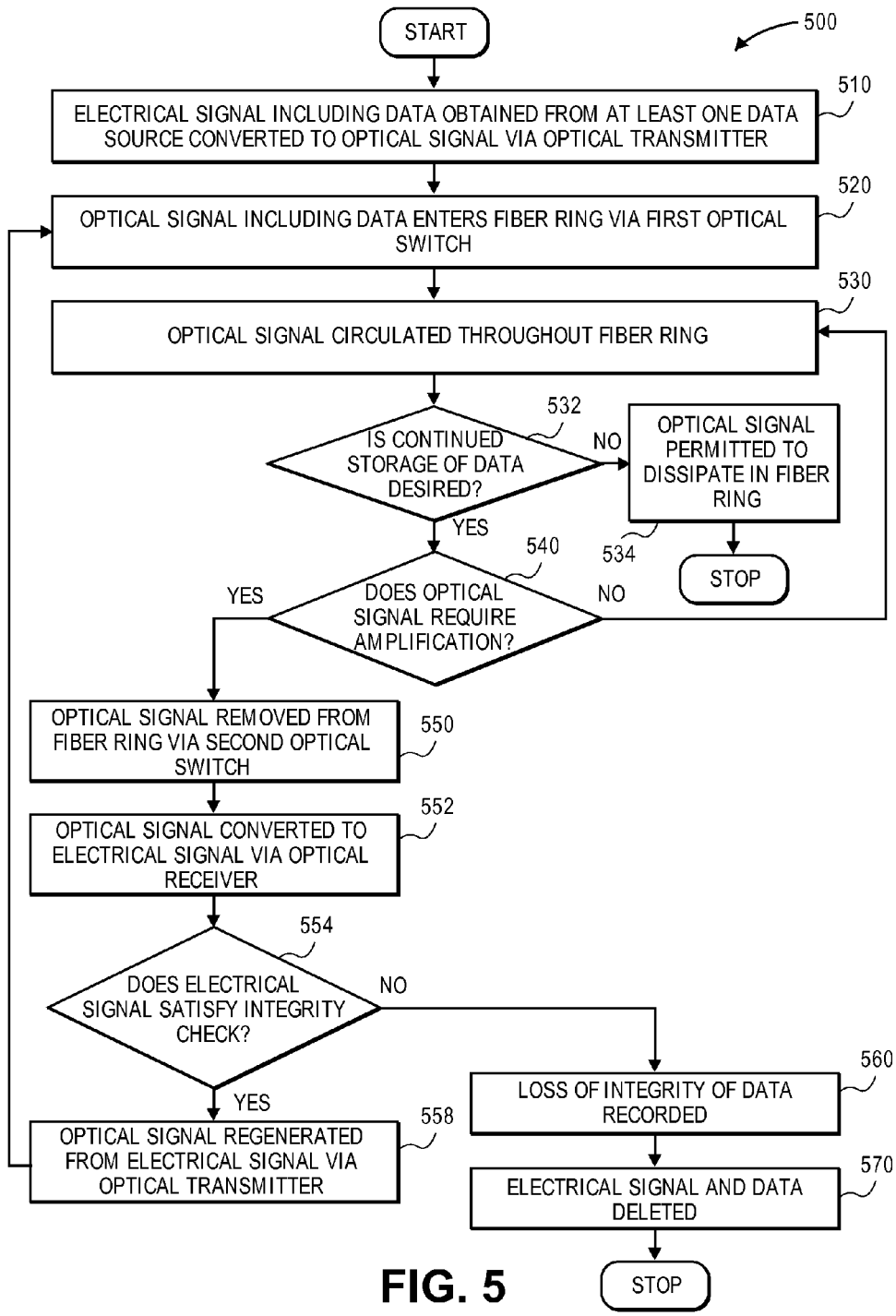
FIG. 5 is a flow chart of one process for storing information or data using an optical transmittal storage network in accordance with embodiments of the present disclosure.

As is discussed above, information or data that is circulated within a fiber ring of an optical transmittal storage node of the present disclosure may be extracted from the fiber ring and amplified, processed, served to a user or computer device that requested the information or data, or subjected to one or more other computer-based processes. Referring to FIG. 5, a flow chart 500 of one process for storing information or data using an optical transmittal storage network in accordance with embodiments of the present disclosure is shown. At box 510, an electrical signal including data that was obtained from at least one data source is converted to an optical signal via an optical transmitter. The electrical signal may include any type of data obtained from one or more data sources, e.g., imaging data obtained from an imaging device provided in a network or array of such devices. At box 520, the optical signal including the data enters a fiber ring via a first optical switch. For example, the optical switch may be an optical phased array switch or like component having multiple ingress ports (or inputs) and egress ports (or outputs), and may preferably have high switch power efficiencies, low signal-to-noise ratios and high switching speeds.

At box 530, the optical signal is circulated throughout the fiber ring. At box 532, whether the continued storage of the data is desired is determined. If the continued storage of the data is no longer desired, then the process advances to box 534, where the optical signal is permitted to dissipate within the fiber ring without further amplification or analysis, and the process ends. If the continued storage of the data is desired, however, then the process advances to box 540, where it is determined whether the optical signal requires amplification. If the optical signal does not require amplification, then the process returns to box 530, where the optical signal and the data are recirculated throughout the fiber ring.

If the optical signal requires amplification, then the process advances to box 550, where the optical signal is removed from the fiber ring via a second optical switch, and to box 552, where the optical signal is converted to an electrical signal via an optical receiver. For example, referring again to FIG. 2A, the optical switch 244 may either extract the optical signals requiring amplification from the fiber ring 240 and transfer the optical signals to the optical receiver 256, or duplicate the optical signals requiring amplification and transfer the duplicated optical signals to the optical receiver 256, while allowing the original optical signals to dissipate within the fiber ring 240. The operation of the second optical switch may be controlled by an analytic edge device or other internal or external control system.

At box 554, the electrical signal is subjected to one or more integrity checks, e.g., verifications of the data included therein, such as mirroring or parity analyses, or checksum calculation. If the integrity of the electrical signal is not satisfactory, then the process advances to box 560, where information regarding a loss of the integrity of the data is recorded, e.g., in a record or file in one or more data stores.

At box 570, the electrical signal and its data are deleted or, alternatively, transferred to an external storage facility, and the process ends.

If the integrity of the electrical signal is satisfactory, however, then the process advances to box 558, where an optical signal is regenerated from the electrical signal, e.g., by converting the electrical signal to another optical signal, using an optical transmitter. The process then returns to box 520, where the optical signal including the data reenters the fiber ring via the first optical switch.

Accordingly, the systems and methods of the present disclosure may store information or data in an optical transmittal storage network having one or more transmittal storage nodes by maintaining the information or data in motion in one or more optical signals within an optical fiber ring, and the optical signals may be extracted from the optical fiber ring and amplified, as necessary, in order to ensure that the optical signals and the information or data stored therein do not attenuate within the optical fiber ring.

Figure 6:
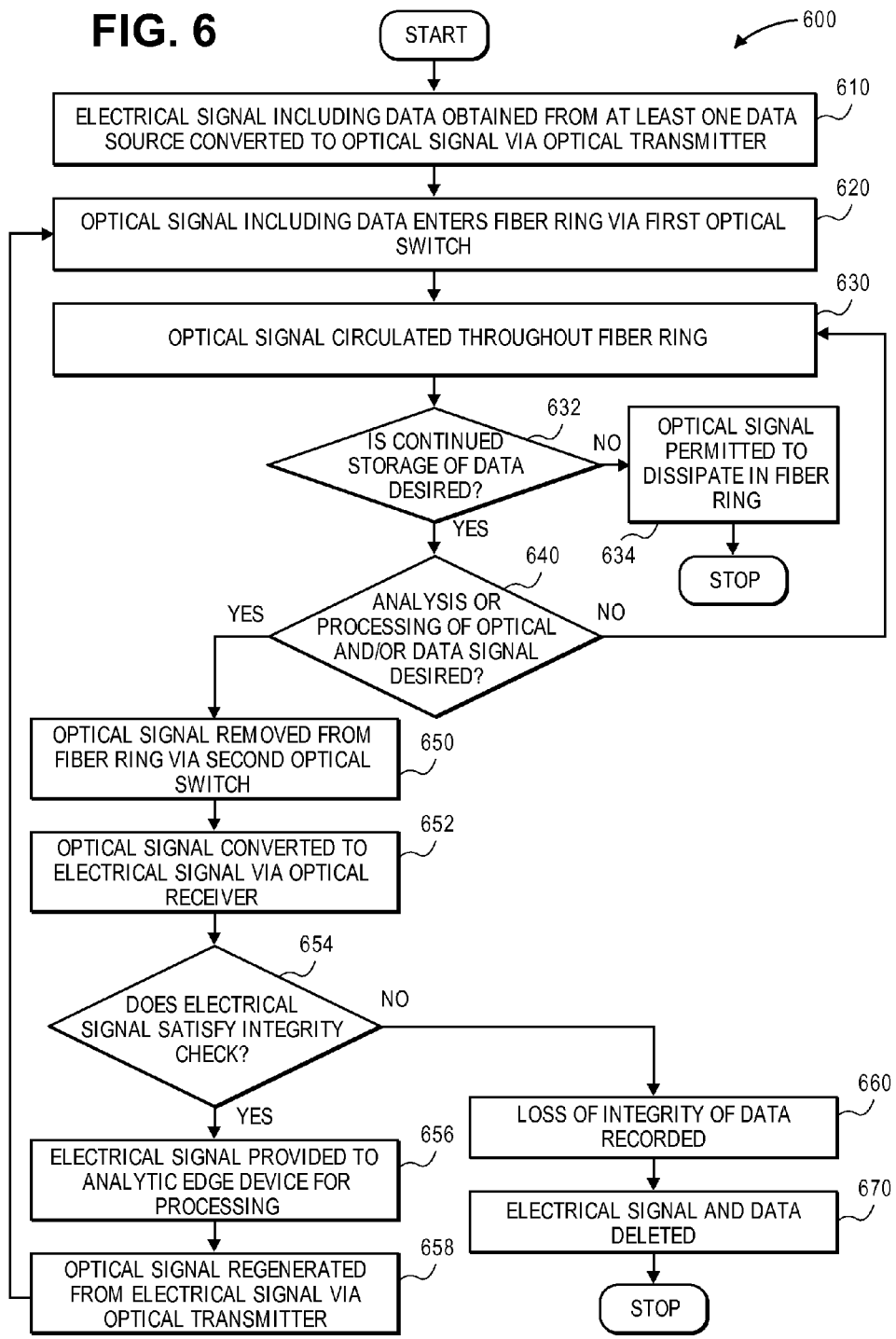
FIG. 6 is a flow chart of one process for analyzing or processing information or data using an optical transmittal storage network in accordance with embodiments of the present disclosure.

Additionally, as is also discussed above, the systems and methods of the present disclosure may enable the information or data circulating within an optical ring to be subjected to one or more analyses or processing techniques. Referring to FIG. 6, a flow chart 600 of one process for analyzing or processing information or data using an optical transmittal storage network in accordance with embodiments of the present disclosure is shown. Except where otherwise noted, reference numerals preceded by the number "6" shown in the block diagram of FIG. 6 indicate components or features that are similar to components or features having reference numerals preceded by the number "5" shown in the flow chart 500 of FIG. 5.

At box 610, an electrical signal including data that was obtained from at least one data source, e.g., one of a plurality of imaging devices provided in a network, is converted to an optical signal via an optical transmitter. At box 620, the optical signal including the data enters a fiber ring via a first optical switch. At box 630, the optical signal is circulated throughout the fiber ring. At box 632, whether the continued storage of the data is desired is determined. If the continued storage of the data is no longer desired, then the process advances to box 634, where the optical signal is permitted to dissipate within the fiber ring without further amplification or analysis, and the process ends.

If continued storage of the data is desired, then the process advances to box 640, whether an analysis or processing of the optical signal or the data therein is desired is determined. If an analysis or processing of the optical signal or the data is not desired, then the process returns to box 630, where the optical signal and the data are recirculated throughout the fiber ring.

If an analysis or processing of the optical signal is desired, however, then the process advances to box 650, where the optical signal is removed from the fiber ring via a second optical switch, and to box 652, where the optical signal is converted to an electrical signal via an optical receiver. At box 654, the electrical signal is subjected to one or more integrity checks, e.g., verifications of the data included therein, such as mirroring or parity analyses, or checksum calculation. If the integrity of the electrical signal is not satisfactory, then the process advances to box 660, where information regarding a loss of the integrity of the data is recorded, e.g., in a record or file in one or more data stores. At box 670, the electrical signal and its data are deleted or, alternatively, transferred to an external storage facility, and the process ends.

If the integrity of the electrical signal is satisfactory, however, then the process advances to box 656, where the electrical signal is provided to an analytic edge device for analysis or processing. The analytic edge device may be configured to perform any type or form of analysis or processing on the data maintained in the electrical signal. For example, where the electrical signal includes one or more packets of imaging data, the analytic edge device may be configured to execute or perform, or request that other computer devices execute or perform edge detection, object recognition, character recognition, image compression, image correction, image filtering, image modeling, image noise reduction, image quantization, image sampling, image scaling, image segmentation, image transformation, or image zooming algorithms or techniques on the imaging data. Where the data includes audio data, the analytic edge device may be configured to execute or perform, or request that other computer devices execute or perform, audio signal processing, audio compression, speech processing or speech recognition algorithms or techniques on the audio data. Other processing algorithms or techniques may include, but are not limited to, encoding, encryption, decoding or decryption processes, or any other type or form of data processing functions or tasks. Such analyses may be performed using one or more computer processors provided in association with the analytic edge device, or using one or more computer devices connected to the analytic edge device over a network.

At box 658, after the data maintained in the electrical signal is processed, an optical signal is regenerated from the electrical signal, e.g., by converting the electrical signal to another optical signal, using an optical transmitter. The process then returns to box 620, where the optical signal including the data reenters the fiber ring via the first optical switch.

Accordingly, the systems and methods of the present disclosure may also conduct one or more processing operations or analyses on information or data stored in an optical transmittal storage network having one or more transmittal storage nodes by extracting the optical signals including the information or data to be analyzed from an optical fiber ring within one of the nodes, converting the optical signals to electrical signals, and processing the electrical signals according to the one or more processing operations or analyses. The electrical signals may then be converted to one or more optical signals, which may be returned to the optical fiber ring and recirculated therein.

Figure 7:
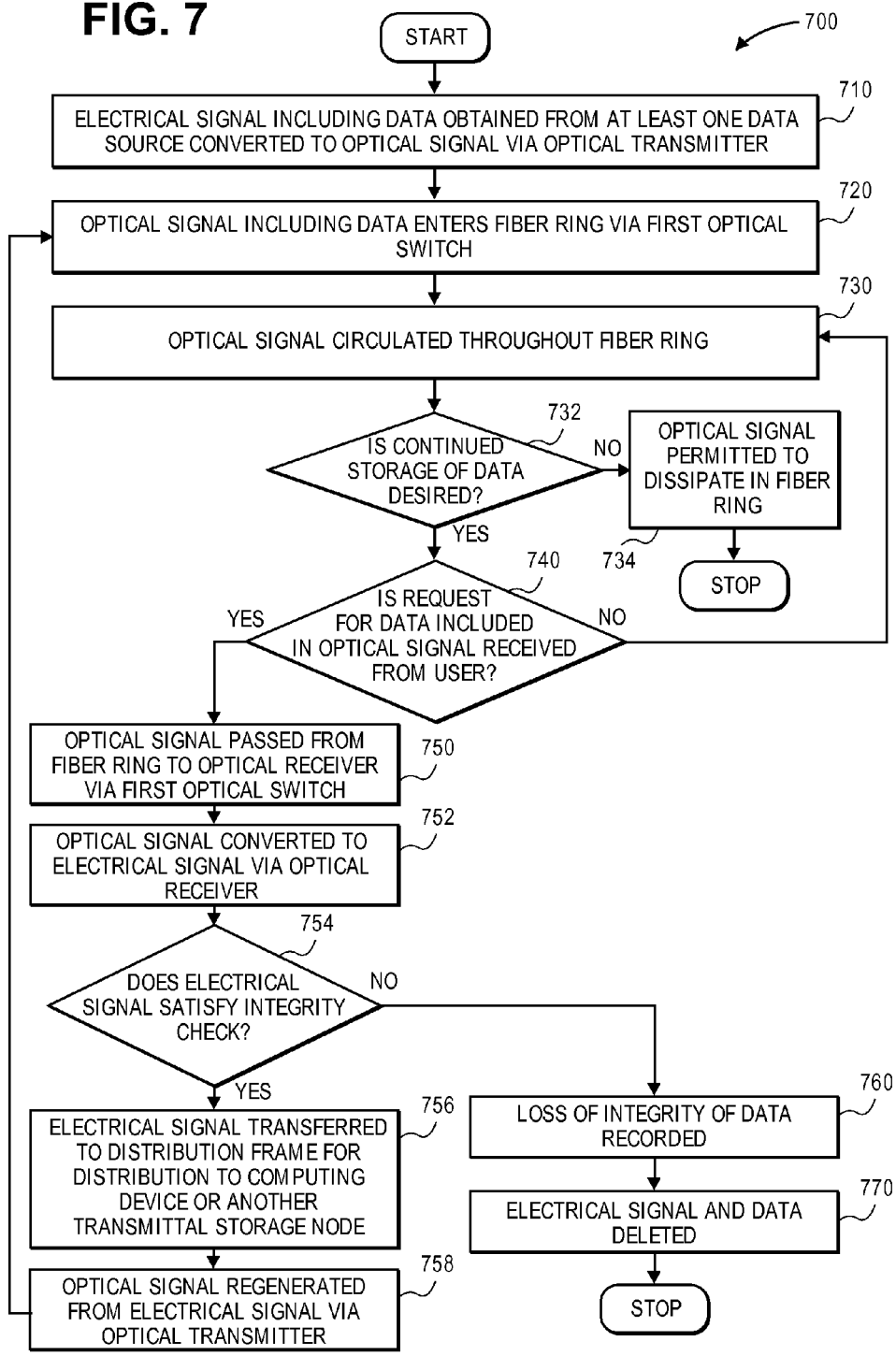
FIG. 7 is a flow chart of one process for transferring or serving information or data using an optical transmittal storage network in accordance with embodiments of the present disclosure.

Additionally, as is further discussed above, the systems and methods of the present disclosure may also transfer information or data circulating within an optical ring to one or more users or computer devices upon request. In this regard, the optical transmittal storage networks may be used to serve information or data, e.g., short-lived content, such as social network feeds or streaming audio or video files, to one or more such devices quickly and efficiently. Referring to FIG. 7, a flow chart 700 of one process for transferring or serving information or data using an optical transmittal storage network in accordance with embodiments of the present disclosure is shown. Except where otherwise noted, reference numerals preceded by the number "7" shown in the block diagram of FIG. 7 indicate components or features that are similar to components or features having reference numerals preceded by the number "6" shown in the process 600 of FIG. 6, or by the number "5" shown in the process 500 of FIG. 5.

At box 710, an electrical signal including data that was obtained from at least one data source, e.g., one of a plurality of imaging devices provided in a network, is converted to an optical signal via an optical transmitter. At box 720, the optical signal including the data enters a fiber ring via a first optical switch. At box 730, the optical signal is circulated throughout the fiber ring. At box 732, whether the continued storage of the data is desired is determined. If the continued storage of the data is no longer desired, then the process advances to box 734, where the optical signal is permitted to dissipate within the fiber ring without further amplification or analysis, and the process ends.

If continued storage of the data is desired, the process advances to box 740, where whether a request for the data included in the optical signal is received from a user is determined. If a request for the data included in the optical signal is not received, then the process returns to box 630, where the optical signal and the data are recirculated throughout the fiber ring.

If a request for the data included in the optical signal is received, however, then the process advances to box 750, where the optical signal is removed from the fiber ring via the first optical switch, and to box 752, where the optical signal is converted to an electrical signal via an optical receiver. At box 754, the electrical signal is subjected to one or more integrity checks, e.g., verifications of the data included therein, such as mirroring or parity analyses, or checksum calculation. If the integrity of the electrical signal is not satisfactory, then the process advances to box 760, where information regarding a loss of the integrity of the data is recorded, e.g., in a record or file in one or more data stores. At box 770, the electrical signal and its data are deleted or, alternatively, transferred to an external storage facility, and the process ends.

If the integrity of the electrical signal is satisfactory, however, then the process advances to box 756, where the electrical signal is transferred to a distribution frame for distribution to a computing device or another transmittal storage node. At box 758, after the electrical signal has been transferred to the distribution frame, an optical signal is regenerated from the electrical signal, e.g., by converting the electrical signal to another optical signal, using an optical transmitter. The process then returns to box 720, where the optical signal including the data reenters the fiber ring via the first optical switch.

Accordingly, the systems and methods disclosed herein may be used to serve information or data that remains in motion within a fiber ring provided in an optical transmittal node to a user upon request, and may amplify or otherwise process an optical signal that includes such information or data prior to returning the optical signal to the fiber ring.

Figure 8:
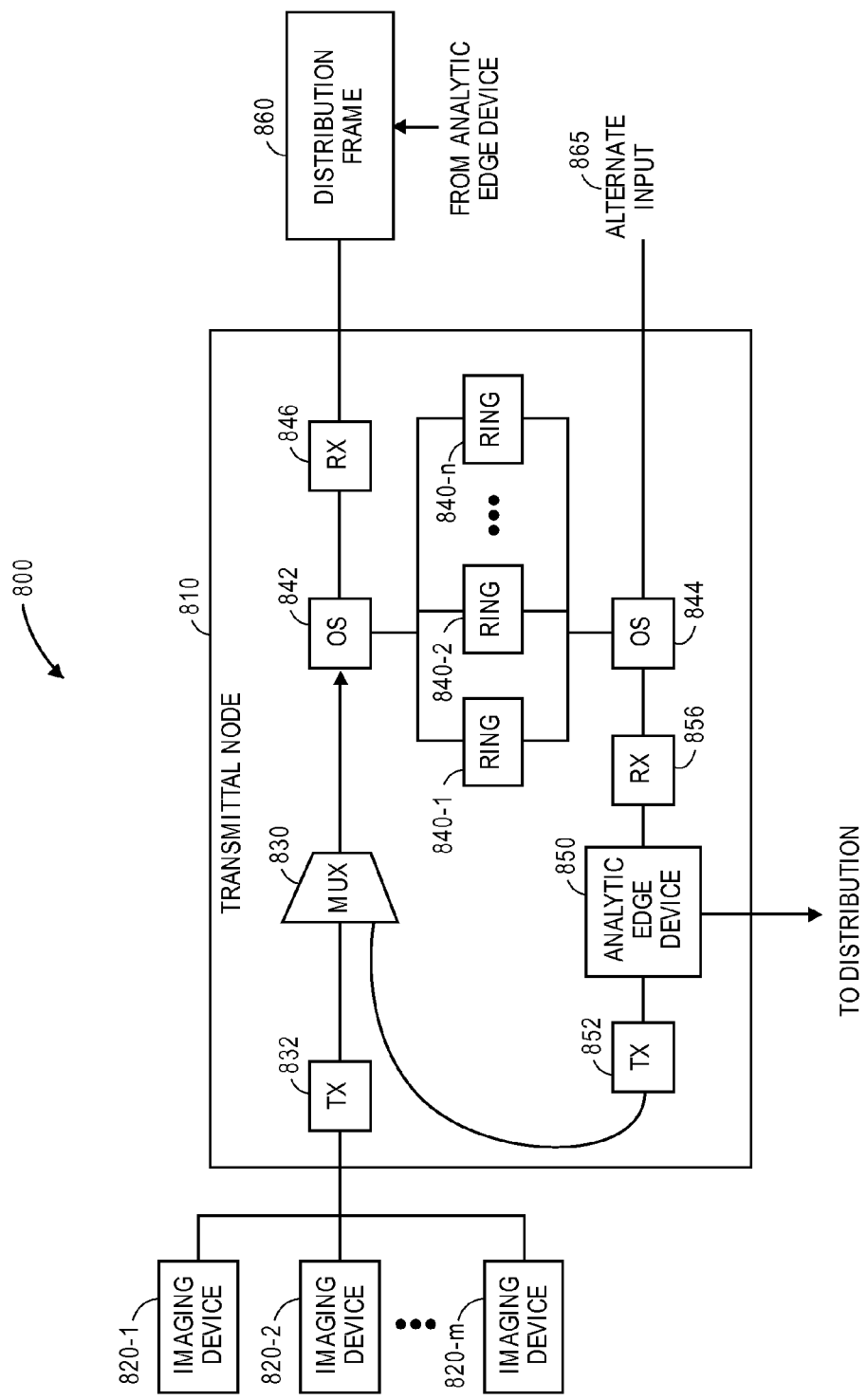
FIG. 8 is a block diagram of components of one system including an optical transmittal storage network in accordance with embodiments of the present disclosure.

As is discussed above, those of ordinary skill in the pertinent arts will recognize that some embodiments of the optical transmittal storage networks and/or transmittal storage nodes disclosed herein may include multiple fiber rings provided in parallel with one another, between a pair of optical switches. Referring to FIG. 8, a block diagram of components of one optical transmittal storage network 800 in accordance with embodiments of the present disclosure is shown. Except where otherwise noted, reference numerals preceded by the number "8" shown in the network 800 of FIG. 8 indicate components or features that are similar to components or features having reference numerals preceded by the number "4" shown in the network 400 of FIG. 4A, by the number "2" shown in the block diagram of FIG. 2A or FIG. 2B, or by the number "1" shown in the network 100 of FIG. 1.

As is shown in FIG. 8, the network 800 includes a transmittal storage node 810, a plurality of m imaging devices 820-1, 820-2 ... 820-m, a distribution frame 860 and an alternate input 865. The imaging devices 820-1, 820-2 ... 820-m are configured to collect imaging data and provide the imaging data to the transmittal storage node 810.

The transmittal storage node 810 includes an optical transmitter 832, a multiplexer 830, a plurality of n fiber rings 840-1, 840-2 ... 840-n, first and second optical switches 842, 844, an optical receiver 846, an analytic edge device 850, an optical transmitter 852 and an optical receiver 856. The optical transmitter 832 is configured to convert the electrical signals comprising the imaging data into optical signals, and to provide the optical signals to the multiplexer 830, which may transfer the optical signals to the first optical switch 842.

The first optical switch 842 is configured to transmit the optical signals received from the multiplexer 830 to either the optical receiver 846, e.g., for converting the optical signals to one or more electrical signals and transferring the electrical signals to the distribution frame 860 for external storage or analysis, or to one or more of the fiber rings 840-1, 840-2 ... 840-n, within which the optical signals and their associated imaging data may circulate. The second optical switch 844 is configured to receive optical signals from one or more of the fiber rings 840-1, 840-2 ... 840-n, or from the alternate input 865, and either return the optical signals to one or more of the fiber rings 840-1, 840-2 ... 840-n, or to pass the optical signals and the imaging data contained therein to the analytic edge device 850 by way of the optical receiver 856.

The second optical switch 844 and/or optical receiver 856 may be any component that is configured to cause one or more of the optical signals circulating throughout one or more of the fiber rings 840-1, 840-2 ... 840-n to be extracted therefrom, optionally amplified, converted into one or more electrical signals, or passed to the analytic edge device 850 for processing and analysis therein. The optical signals and their packets of information or data may be extracted from the fiber rings 840-1, 840-2 ... 840-n on any basis. Additionally, the analytic edge device 850 may amplify the electrical signals and the information or data maintained therein, and perform one or more analytic functions on the information or data, or convert the electrical signals including the information or data back into optical signals, and return the optical signals to the multiplexer 830. The analytic edge device 850 may further control the timing by which optical signals are extracted from the fiber rings 840-1, 840-2 ... 840-n, processed, amplified and/or returned to the fiber rings 840-1, 840-2 ... 840-n, such that packets of information included in such optical signals may be processed in a synchronous or asynchronous manner.

The parallel arrangement of the fiber rings 840-1, 840-2 ... 840-n of the transmittal storage node 810 may enhance the storage capacity of the fiber rings 840-1, 840-2 ... 840-n by extending the inherent delays associated with the circulation of optical signals including the packets of information or data. For example, the first and second optical switches 842, 844 may cause the optical signals to be transferred between or among the various fiber rings 840-1, 840-2 ... 840-n, thereby lengthening the time during which the information or data may remain within the transmittal storage node 810. Providing multiple fiber rings 840-1, 840-2 ... 840-n further enables the transmittal storage node 810 to accommodate more irregular inflows of imaging data from the imaging devices 820-1, 820-2 ... 820-m, e.g., in bursts or pulses of imaging data of varying volumes or durations.

Figure 9:
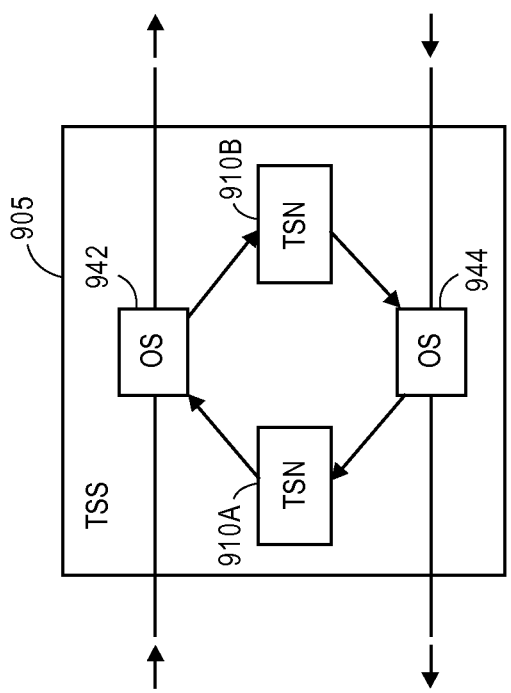
FIG. 9 is a block diagram of aspects of an optical transmittal storage network in accordance with embodiments of the present disclosure.

As is discussed above, two or more of the transmittal storage nodes of the present disclosure may be effectively provided in a single transmittal storage switch, e.g., between optical switches in parallel, such that the electrical signals or optical signals may be received at the transmittal storage switch and transferred to one or more of the transmittal storage nodes provided therein, or permitted to pass through to another node or element. Referring to FIG. 9, a transmittal storage switch 905 that may be utilized in one embodiment of an optical transmittal storage network in accordance with embodiments of the present disclosure is shown. Except where otherwise noted, reference numerals preceded by the number "9" shown in the transmittal storage switch 905 of FIG. 9 indicate components or features that are similar to components or features having reference numerals preceded by the number "8" in the network 800 of FIG. 8, by the number "4" shown in the network 400 of FIG. 4A, by the number "2" shown in the block diagram of FIG. 2A or FIG. 2B, or by the number "1" shown in the network 100 of FIG. 1.

As is shown in FIG. 9, the transmittal storage switch 905 includes a pair of optical switches 942, 944 aligned in parallel, with two transmittal storage nodes 910A, 910B provided therein. The transmittal storage switch 905 includes a pair of ingress ports (or inputs) and a pair of egress ports (or outputs). Thus, information or data entering the transmittal storage switch 905 may be transferred to the first optical switch 942 and to either the second transmittal storage node 910B or out of the transmittal storage switch 905. Likewise, information or data entering the transmittal storage switch 905 may be transferred to the second optical switch 944, and to either the first transmittal storage node 910A or out of the transmittal storage switch 905. In either instance, the transmittal storage switch 905 may introduce delays into the process by which information or data is transferred therein or therefrom, by way of the optical fiber rings provided within the transmittal storage nodes 910A, 910B (not shown), thereby enabling information or data to be stored within the transmittal storage switch 905 by maintaining the information or data in motion therein.

Figure 10:
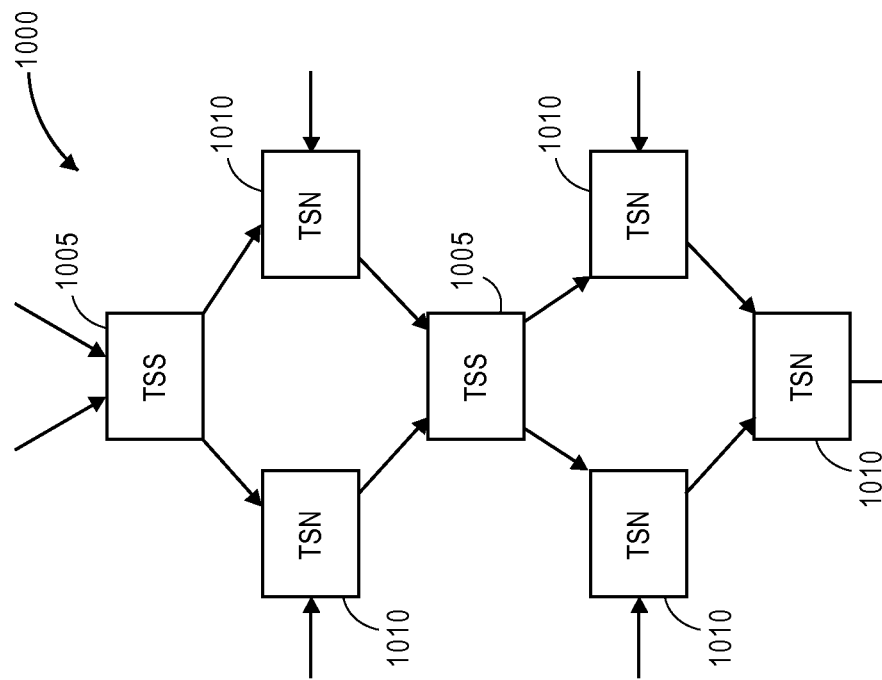
FIG. 10 is a block diagram of aspects of an optical transmittal storage network in accordance with embodiments of the present disclosure.

Similarly, the various transmittal storage nodes or transmittal storage switches disclosed herein may be provided in an array, a lattice, or a fabric-like layout. Referring to FIG. 10, an optical transmittal storage network 1000 is shown. Except where otherwise noted, reference numerals preceded by the number "10" shown in the network 1000 of FIG. 10 indicate components or features that are similar to components or features having reference numerals preceded by the number "9" in the transmittal storage switch 905 of FIG. 9, by the number "8" in the network 800 of FIG. 8, by the number "4" shown in the network 400 of FIG. 4A, by the number "2" shown in the block diagram of FIG. 2A or FIG. 2B, or by the number "1" shown in the network 100 of FIG. 1.

The transmittal storage network 1000 includes a plurality of transmittal storage switches 1005 and transmittal storage nodes 1010 provided in an array, a lattice, or a fabric-like layout. The transmittal storage nodes 1010 may include two ingress points and two egress points, while the transmittal storage switches 1005 may include two ingress points and two egress points. For example, referring again to FIG. 2A, the transmittal storage node 210 is configured to receive inputs of information or data from the data sources 220-1, 220-2, 220-3 by way of the multiplexer 230, as well as the secondary input 265. Meanwhile, the transmittal storage switches 1005 may transfer one or more optical signals to another transmittal storage switch 1005 or transmittal storage node 1010, or to another system or entity (not shown).

The fabric-like layout of the transmittal storage network 1000 of FIG. 10 enables information or data to be passed between and among transmittal storage switches 1005 and transmittal storage nodes 1010 for a variety of purposes. For example, referring again to FIG. 4B, optical signals including such information or data may be transferred from transmittal storage node 1010 to transmittal storage node 1010, and the various processing tasks (e.g., background detection, foreground detection, facial recognition, object recognition) may be performed on the information or data included within such signals on each of the respective transmittal storage nodes 1010.

Those of ordinary skill in the pertinent arts will recognize that the systems and methods of the present disclosure may be utilized or incorporated in any application, system or device in which the collection, streaming, transmission, storage, processing, retrieval or service of information or data is desired. For example, where a sufficient amount or extent of bandwidth is reliably available, one or more embodiments of the present disclosure may be provided or combined to form a "server-less" virtual facility for storing content (e.g. multimedia). The facility may effectively store information or data such as audio files, video files or other multimedia while the information or data is transferred through cables or optical fiber, particularly where the information or data is received from one or more data sources at fixed or predictable rates, or where the information or data may be expected to expire or have limited relevance at predetermined or predictable time. In this regard, the systems and methods of the present disclosure may effectively eliminate the need for large-scale storage facilities including one or more servers.

Additionally, the systems and methods disclosed herein may be particularly valuable for use in streaming multimedia applications or services. In such applications, the media to be streamed (e.g., digital music files or video files of any type or form) may be stored in packets within the transmission medium itself while some or all of the packets are streamed and consumed by multiple users. Where a transmission network is sufficiently large, and configured to incorporate a delay that may be systematically introduced using one or more fiber rings, packets of data may be persisted within the transmission network and made available for streaming or consumption.

Some embodiments of the present disclosure may also provide streaming storage for extremely large networks of data sources (e.g., a homogeneous network of sources) such as imaging devices. For example, where a surveillance network includes one million cameras, with each of the cameras configured to capture and transmit data at a rate of two million bytes per second (or 2 MBps), a total of two terabytes (or 2 TB) of imaging data will be streamed through the network per second. Therefore, incorporating a delay of two minutes (e.g., a two-minute delay between the generation of the imaging data at one end and the availability of the data at another end) into such networks enables a total of two hundred forty terabytes (or 240 TB) may be effectively stored within the network at any given time. While the imaging data is being circulated within the surveillance network, the imaging data may be evaluated in order to identify its contents or relevance using one or more detection, recognition or classification functions, or perform any other analyses on the imaging data.

Similarly, some other embodiments of the present disclosure may perform one or more analytical applications on packets of information or data circulating within a transmission medium to determine the relevance of each of the individual packets prior to transmitting any of the packets to a resident data store. In this regard, relevant packets of information or data may be sifted or filtered from irrelevant packets while the packets are in motion, with the irrelevant packets being discarded, and the relevant packets being transferred to one or more data stores for long-term storage. Thus, the systems and methods of the present disclosure may be used to reduce the volume of data that is ultimately transferred to a long-term data storage unit, while likewise reducing the extent of the available bandwidth occupied thereby.

The systems and methods of the present disclosure provide a number of advantages over prior art data collection and storage systems. For example, such systems and methods may effectively utilize dark fiber, e.g., optical fiber infrastructure that is installed in place but is not in use, to circulate and store data packets that are commonly accessed by one or more users. One or more repeaters or regenerators, including various analytic edge devices and/or amplifiers, as well as optical receivers, transmitters or transducers, may be added to nodes or other aspects of networks in order to maintain optical signals with sufficient integrity within the dark fiber and to overcome any losses that may be encountered therein.

Similarly the systems and methods of the present disclosure may be used to manage the distribution and storage of multimedia across networks having geographically dispersed components. Information or data may be transferred across such networks from a node in a first location to another node in a second location at a manageable transfer rate, and virtually assembled in the node at the second location over time. Additionally, the systems and methods of the present disclosure may substitute fiber rings for cloud-based components, thereby enabling users to access packets of information or data that remain in motion within the fiber rings from any number of devices that are connected to the fiber rings, rather than requiring each of the devices to synchronize with the cloud-based components Furthermore, the systems and methods of the present disclosure may be particularly well-suited for transient storage of short-lived content, such as social network feeds or instant messaging audio or video files that are consumed as promptly as they are generated, and which have a limited period of relevancy. Currently, social networks and messaging systems feature growing numbers of users, who tend to generate data of diminishing relevance over time at fluctuating rates. In such situations, because the feeds or files need not be stored for extended durations, expending resources on components such as servers in order to store or analyze the transient content at peak times or transmission frequencies is inefficient and unnecessary. Instead, one or more optical transmittal storage networks may be provided in order to at least temporarily maintain the feeds or files in motion within one or more fiber rings, as long as demand for such feeds or files may exist.

Similarly, the systems and methods of the present disclosure may incorporate optical transmittal storage networks into "on-the-fly" analysis tools such as spam filtering, code or data processing, or the like. For example, a predetermined set of keywords, phrases, whitelisted or blacklisted addresses, business rules or the like for defining unwanted content, such as spam, may be made accessible to one or more analytic edge devices, and incoming messages including information or data may be passed to one or more fiber rings and processed according to established protocols with respect to such keywords, phrases, addresses, rules or the like. Information or data having a limited duration of relevance may also be maintained within an optical transmittal storage network having a plurality of fiber rings or like components, and access to the transmittal storage network or such components may be limited to personnel having predetermined levels of security clearance or access. Likewise, an optical transmittal storage network having a plurality of storage nodes may include nodes that are each configured or configurable for storing packets of information or data of a particular type, size or scope.

Although the disclosure has been described herein using exemplary techniques, components, and/or processes for implementing the systems and methods of the present disclosure, it should be understood by those skilled in the art that other techniques, components, and/or processes or other combinations and sequences of the techniques, components, and/or processes described herein may be used or performed that achieve the same function(s) and/or result(s) described herein and which are included within the scope of the present disclosure. For example, although some of the embodiments described herein or shown in the accompanying figures refer to the use of imaging devices such as digital cameras that are posted in fulfillment centers, the systems and methods disclosed herein are not so limited, and may utilize any type of data source that is provided in any environment and for any purpose. Additionally, while some of the embodiments disclosed herein include networks consisting solely of imaging devices and/or switching components, edge devices or fiber rings, those of ordinary skill in the pertinent arts will recognize that such networks may include one or more related, complementary or auxiliary devices that may aid in the performance or execution of one or more of the actions or functions disclosed herein.

It should be understood that, unless otherwise explicitly or implicitly indicated herein, any of the features, characteristics, alternatives or modifications described regarding a particular embodiment herein may also be applied, used, or incorporated with any other embodiment described herein, and that the drawings and detailed description of the present disclosure are intended to cover all modifications, equivalents and alternatives to the various embodiments as defined by the appended claims. Moreover, with respect to the one or more methods or processes of the present disclosure described herein, including but not limited to the flow charts shown in FIG. 3, 5, 6 or 7, orders in which such methods or processes are presented are not intended to be construed as any limitation on the claimed inventions, and any number of the method or process steps or boxes described herein can be combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain embodiments could include, or have the potential to include, but do not mandate or require, certain features, elements and/or steps. In a similar manner, terms such as "include," "including" and "includes" are generally intended to mean "including, but not limited to." Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

The elements of a method, process, or algorithm described in connection with the embodiments disclosed herein can be embodied directly in hardware, in a software module stored in one or more memory devices and executed by one or more processors, or in a combination of the two. A software module can reside in RAM, flash memory, ROM, EPROM, EEPROM, registers, a hard disk, a removable disk, a CD-ROM, a DVD-ROM or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile. The processor and the storage medium can reside in an ASIC. The ASIC can reside in a user terminal. In the alternative, the processor and the storage medium can reside as discrete components in a user terminal.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative embodiments thereof, the foregoing and various other additions and omissions may be made therein and thereto without departing from the spirit and scope of the present disclosure.

What is claimed is:

1. A monitoring system comprising:
   a plurality of imaging devices;
   at least one transmittal storage node; and
   at least one computer device comprising a memory and a processor configured to implement one or more services,
   wherein the at least one transmittal storage node comprises:
      at least one optical transmitter;
      a multiplexer;

a first optical switch;
a second optical switch;
at least one optical fiber ring extending in parallel between the first optical switch and the second optical switch;
an analytic edge device extending between the second optical switch and the multiplexer; and
at least one optical receiver,
wherein the one or more services are configured to:
  capture a first set of imaging data using at least a first one of the plurality of imaging devices;
  transmit a first electrical signal comprising the first set of imaging data from the first one of the plurality of imaging devices to the at least one optical transmitter;
  convert, by the at least one optical transmitter, the first electrical signal into a first optical signal comprising at least some of the first set of imaging data;
  transmit the first optical signal comprising the at least some of the first set of imaging data from the at least one optical transmitter to the multiplexer;
  transfer the first optical signal from the multiplexer to the first optical switch;
  transfer, by the first optical switch, the first optical signal into the at least one optical fiber ring at a first time; and
  transfer, by the second optical switch, the first optical signal out of the at least one optical fiber ring at a second time;
  transfer the first optical signal from the second optical switch to the at least one optical receiver;
  convert, by the at least one optical receiver, the first optical signal into a second electrical signal, wherein the second electrical signal comprises the at least some of the first set of imaging data; and
  transmit the second electrical signal from the at least one optical receiver to the analytic edge device.

2. The monitoring system of claim 1, wherein the one or more services are further configured to:
  transmit the second electrical signal from the analytic edge device to the at least one optical transmitter;
  convert, by the at least one optical transmitter, the second electrical signal into a second optical signal comprising the at least some of the first set of imaging data; and
  transmit the second optical signal comprising the at least some of the first set of imaging data from the at least one optical transmitter to the multiplexer;
  transfer the second optical signal from the multiplexer to the first optical switch; and
  transfer, by the first optical switch, the second optical signal into the at least one optical fiber ring at a third time.

3. The monitoring system of claim 1, wherein the one or more services are further configured to:
  perform, by the analytic edge device, at least one processing task on the second electrical signal,
  wherein the at least one processing task comprises at least one of edge detection, object recognition, character recognition, image compression, image correction, image filtering, image modeling, image noise reduction, image quantization, image sampling, image scaling, image segmentation, image transformation, image zooming, audio signal processing, audio compression, speech processing or speech recognition of the at least some of the first set of imaging data.

4. The monitoring system of claim 1, wherein the at least one transmittal storage node further comprises at least one optical amplifier, and
  wherein the one or more services are further configured to:
    amplify the first optical signal using at least one optical amplifier prior to the first time.

5. The monitoring system of claim 1, wherein the first optical switch is an optical phased array switch having at least two ingress ports and at least two egress ports,
  wherein at least a first portion of the optical fiber ring is linked to a first one of the ingress ports,
  wherein the multiplexer is linked to a second one of the ingress ports,
  wherein a distribution frame is linked to a first one of the egress ports, and
  wherein at least a second portion of the optical fiber ring is linked to a second one of the egress ports.

6. The monitoring system of claim 1, wherein the at least one optical fiber ring comprises at least one optical fiber circumvolved about a bobbin, and
  wherein the at least one optical fiber has a refractive index of approximately 1.4 and a length of at least one kilometer.

7. A method comprising:
  generating a first optical signal comprising a first set of data;
  transferring, by a first optical switch, the first optical signal into at least one optical fiber ring at a first time, wherein the first optical switch is an optical phased array switch comprising a first ingress port, a second ingress port, a first egress port and a second egress port, and wherein transferring the first optical signal into the at least one optical fiber ring at the first time comprises:
    providing the first optical signal to a multiplexer associated with the first ingress port;
    transferring the first optical signal from the multiplexer into the first ingress port; and
    transferring the first optical signal into at least one optical fiber ring at the first time via the first egress port;
  transferring, by a second optical switch, the first optical signal out of the at least one optical fiber ring at a second time;
  generating a second optical signal comprising at least some of the first set of data; and
  transferring, by the first optical switch, the second optical signal into the at least one fiber ring at a third time.

8. The method of claim 7, further comprising:
  generating a first electrical signal based at least in part on the first optical signal using at least one optical receiver, wherein the first electrical signal comprises the at least some of the first set of data; and
  transferring at least the first electrical signal to an analytic edge device.

9. The method of claim 8, further comprising:
  conducting, by the analytic edge device, an analysis of the at least some of the first set of data included in the first electrical signal.

10. The method of claim 9, wherein the analysis comprises at least one of edge detection, object recognition, character recognition, image compression, image correction, image filtering, image modeling, image noise reduction, image quantization, image sampling, image scaling, image segmentation, image transformation, image zooming, audio signal processing, audio compression, speech processing or speech recognition.

11. The method of claim 7, further comprising:
amplifying the second optical signal using at least one optical amplifier after the second time and prior to the third time,
wherein the at least one optical amplifier is an erbium-doped fiber amplifier.

12. The method of claim 7, wherein the at least one optical fiber ring comprises at least one optical fiber coiled about a bobbin, and
wherein the at least one optical fiber has a length of at least one kilometer.

13. The method of claim 7, wherein generating the first optical signal comprising the first set of data further comprises:
capturing at least the first set of data using at least one sensing device, and
transferring a first electrical signal comprising the at least some of the first set of data from the at least one sensing device to an optical transmitter;
converting, using the optical transmitter, the first electrical signal into the first optical signal.

14. The method of claim 13, wherein generating the first optical signal comprising the first set of data further comprises:
amplifying the first optical signal using at least one fiber amplifier.

15. The method of claim 13, wherein generating the first optical signal comprising the first set of data further comprises:
isolating the first optical signal to a predefined wavelength or band of wavelengths using at least one optical isolator.

16. The method of claim 13, wherein the at least one sensing device is one of a plurality of imaging devices configured to capture imaging data from a predetermined environment.

17. A method comprising:
generating a first optical signal comprising a first set of data;
transferring, by a first optical switch, the first optical signal into at least one optical fiber ring at a first time;
transferring, by a second optical switch, the first optical signal out of the at least one optical fiber ring at a second time, wherein the second optical switch is an optical phased array switch comprising a first ingress port, a second ingress port, a first egress port and a second egress port, and wherein transferring, by the second optical switch, the first optical signal out of the at least one optical fiber ring at the second time comprises:
transferring the first optical signal out of the at least one optical fiber ring at the second time via the first ingress port; and
transferring the first optical signal to at least one optical receiver via the first egress port;
generating a second optical signal comprising at least some of the first set of data, wherein generating the second optical signal comprising the at least some of the first set of data comprises:
converting, by the at least one optical receiver, the first optical signal into a second electrical signal, wherein the second electrical signal comprises the at least some of the first set of data;
transmitting the second electrical signal from the at least one optical receiver to at least one optical transmitter; and
converting, by the at least one optical transmitter, the second electrical signal into the second optical signal; and
transferring, by the first optical switch, the second optical signal into the at least one fiber ring at a third time.

18. A method comprising:
receiving a request for at least one set of data from at least one user;
identifying at least one packet comprising the at least one set of data, wherein the at least one packet is maintained in a first optical signal circulating within an optical fiber ring comprising at least one optical fiber;
transferring, by a first optical phased array switch, the first optical signal in which the at least one packet is maintained out of the optical fiber ring, wherein the first optical phased array switch comprises a plurality of ingress ports and a plurality of egress ports;
converting, by a first optical receiver, the first optical signal to a first electrical signal, wherein the first electrical signal comprises the at least one packet;
transmitting the first electrical signal from the first optical receiver to at least one computing device associated with the user over a network;
converting, by a first optical transmitter, the first electrical signal to a second optical signal;
amplifying, by at least one fiber amplifier, the second optical signal; and
transferring, by a second optical phased array switch, the second optical signal into the optical fiber ring, wherein the second optical phased array switch comprises a plurality of ingress ports and a plurality of egress ports,
wherein the at least one optical fiber is provided in parallel between the first optical phased array switch and the second optical phased array switch.

19. The method of claim 18, wherein the first optical signal is transferred out of the optical fiber ring via one of the plurality of egress ports of the first optical phased array switch, and
wherein the second optical signal is transferred into the optical fiber ring via one of the plurality of ingress ports of the second optical phased array switch.

20. The method of claim 18, wherein the at least one optical fiber is a non-linear optical fiber circumvolved about a bobbin, and
wherein the non-linear optical fiber has a core diameter of approximately five micrometers, a refractive index of approximately 1.4 and a length of at least one kilometer.

* * * * *